(12) United States Patent
Burrow et al.

(10) Patent No.: US 9,019,468 B2
(45) Date of Patent: Apr. 28, 2015

(54) INTERFERENCE PROJECTION EXPOSURE SYSTEM AND METHOD OF USING SAME

(75) Inventors: Guy Matthew Burrow, Atlanta, GA (US); Thomas K. Gaylord, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 822 days.

(21) Appl. No.: 13/249,841

(22) Filed: Sep. 30, 2011

(65) Prior Publication Data
US 2012/0081687 A1  Apr. 5, 2012

Related U.S. Application Data

(60) Provisional application No. 61/388,367, filed on Sep. 30, 2010, provisional application No. 61/388,365, filed on Sep. 30, 2010.

(51) Int. Cl.
*G02B 27/10* (2006.01)
*G03F 7/20* (2006.01)

(52) U.S. Cl.
CPC ............. *G02B 27/10* (2013.01); *G03F 7/70208* (2013.01); *G03F 7/70408* (2013.01)

(58) Field of Classification Search
CPC ............. G03F 7/70208; G03F 7/70275; G03F 7/70408; G03F 7/7045; G02B 27/10; G02B 27/72; G02B 27/54
USPC ........................ 355/46, 52, 53, 55, 67–71, 77; 250/492.1, 492.2, 492.22, 548; 430/1
See application file for complete search history.

(56) References Cited

U.S. PATENT DOCUMENTS

| | | | | |
|---|---|---|---|---|
| 5,142,385 A * | 8/1992 | Anderson et al. | ................ | 359/10 |
| 5,579,147 A * | 11/1996 | Mori et al. | ................ | 359/204.1 |
| 5,638,211 A * | 6/1997 | Shiraishi | ................ | 359/559 |
| 5,715,039 A * | 2/1998 | Fukuda et al. | ................ | 355/53 |
| 6,249,335 B1 * | 6/2001 | Hirukawa et al. | ................ | 355/53 |
| 7,046,342 B2 * | 5/2006 | Hinsberg et al. | ................ | 355/75 |
| 7,170,588 B2 * | 1/2007 | Smith | ................ | 355/71 |
| 7,508,488 B2 * | 3/2009 | Freimann et al. | ................ | 355/53 |
| 2002/0149849 A1 * | 10/2002 | Kelsey et al. | ................ | 359/577 |
| 2008/0094600 A1 * | 4/2008 | Freimann | ................ | 355/71 |
| 2009/0208878 A1 * | 8/2009 | Loopstra et al. | ................ | 430/322 |
| 2010/0123887 A1 * | 5/2010 | De Winter et al. | ................ | 355/55 |

* cited by examiner

*Primary Examiner* — Christina Riddle
(74) *Attorney, Agent, or Firm* — Troutman Sanders LLP; Ryan A. Schneider; Christopher W. Glass

(57) ABSTRACT

An exemplary embodiment of the present invention provides an interference projection exposure system comprising a beam-providing subsystem and an objective lens subsystem that can provide a plurality of light beams which intersect and interfere at an image plane to produce a high spatial frequency periodic optical-intensity distribution. The interference projection system can further comprise a pattern mask that can alter the periodic optical-intensity distribution so as to incorporate functional elements within the periodic optical-intensity distribution. The beam providing subsystem can comprise a beam generating subsystem, a beam conditioning subsystem and a beam directing subsystem. Another exemplary embodiment of the present invention provides for a method of producing a high spatial frequency periodic optical-intensity distribution using a interference projection exposure system.

22 Claims, 15 Drawing Sheets

(a)  (b)

INTERFERENCE PROJECTION EXPOSURE SYSTEM AND METHOD OF USING SAME

CROSS-REFERENCE TO RELATED APPLICATIONS

This application claims the benefit of U.S. Provisional Application Ser. No. 61/388,365, filed on 30 Sep. 2010, and U.S. Provisional Application Ser. No. 61/388,367, filed on 30 Sep. 2010, which are incorporated herein by reference in their entireties as if fully set forth below.

FEDERALLY SPONSORED RESEARCH STATEMENT

The invention described in this patent application was made with Government support under Agreement No. ECCS-0925119, awarded by The National Science Foundation. The Government has certain rights in the invention described in this patent application

TECHNICAL FIELD

The various embodiments of the present invention relate generally to interference and projection exposure systems and methods of using the system to produce high-spatial-frequency optical-intensity distributions.

BACKGROUND

Microelectronics continues to impact society in a multitude of ways every day. The semiconductor revolution is the engine that drives cell phones, the internet, flat-panel televisions, flash memory chips, global positioning system devices, solar cells, etc. Microelectronics has had a profound impact on the fields of biomedicine, transportation, communications, entertainment, defense, environmental monitoring, and homeland security.

For more than three decades optical lithography has been the recipe for success to meet the semiconductor industry's steady decrease in device size as described by Moore's law. In 1965, Gordon Moore, the co-founder of Intel, predicted that the number of transistors in a commercial integrated circuit would double every two years. Up until now, this prediction has accurately stood the test of time. However, since the second decade of the twenty first century, there has been serious doubt that conventional optical lithography can continue to provide the needed decreasing sizes. Efforts to decrease the wavelength of the source (e.g. from 192 nm to 157 nm) have not been successful. Increasing the surrounding refractive index in immersion lithography (e.g. from 1.44 to 1.65) remains in research and development. New approaches are needed. Techniques being considered include 1) self-assembly approaches; 2) construction-based approaches including immersion lithography, double patterning, double exposure, two-photon lithography, printing, direct writing, source mask optimization, and micromanipulation; and 3) interference lithography.

Modern integrated circuits have very regular layouts with an underlying grid pattern that defines the smallest feature size in the integrated circuit. Multi-beam interference lithography (MBIL) can be used to define this underlying grid. MBIL immediately has the advantages of 1) simple optics, 2) large working distances, 3) high-speed processing, 4) low cost, and 5) extendable to higher resolutions. As such, MBIL could be a cornerstone for future optical lithography systems. The flexibility of interference lithography to produce maskless high-spatial-frequency periodic patterning, combined with other lithographic techniques (e.g. projection lithography, e-beam lithography, self-assembly), should play a key role in sustaining the demands of the microelectronics industry to reduce feature size with simple, inexpensive, large-area periodic nanoscale patterning.

Several other technologies, such as photonic crystal technology, metamaterials, biomedical structures, subwavelength structures, and optical traps can be developed or improved by new advances in MBIL technologies. For example, photonic crystal technology has many important possible commercial applications. The technology potentially offers lossless control of light propagation at a size scale near the order of the wavelength of light. This technology has the potential to produce the first truly dense integrated photonic circuits and systems (DIPCS). Individual components that are being developed include resonators, antennas, sensors, multiplexers, filters, couplers, and switches. The integration of these components would produce DIPCS that would perform functions such as image acquisition, target recognition, image processing, optical interconnections, analog-to-digital conversion, and sensing. Further, the resulting DIPCS would be very compact in size and highly field-portable. Applications using light at telecommunications wavelengths require structures to be fabricated with nano-sized dimensions. Despite the advantages and benefits of using such a technology in commercial devices, the practical commercial development of PC structures has been very slow.

BRIEF SUMMARY

The various embodiments of the present invention provide an interference projection exposure system for producing high-spatial-frequency periodic optical-intensity distributions with incorporated functional elements, and methods of producing the optical-intensity distribution using the interference projection exposure system.

An exemplary embodiment of the present invention is an interference projection exposure system having a beam-providing subsystem configured to provide a plurality of light beams and an objective lens subsystem. The objective lens subsystem can have an object plane, an objective lens and an image plane. The objective lens subsystem can be configured to receive the plurality of light beams from the beam-providing subsystem such that the plurality of beams intersect and interfere at the image plane to produce a high-spatial-frequency periodic optical-intensity distribution with incorporated functional elements. The plurality of light beams can intersect at the object plane of the objective lens subsystem between the beam-providing subsystem and the objective lens.

The interference projection exposure system can also include a pattern mask located at the object plane of the objective lens subsystem. The pattern mask can selectively remove or alter a functional element pattern from the periodic optical-intensity distribution.

In an embodiment, the plurality of light beams is a plurality of collimated light beams. The plurality of collimated light beam can diverge or converge at the image plane of the objective lens in order to produce a periodic lattice with gradually changing periodicity.

In another embodiment of the present invention, the beam-providing subsystem of the interference projection exposure system can also include a beam-generating subsystem configured to generate the plurality of light beams, a beam-conditioning subsystem that can have a plurality of beam-conditioners and is configured to receive the plurality of light beams from the beam-generating subsystem, and a beam-directing subsystem that can have a plurality of beam-directing elements and can receive the plurality of light beams from the beam-generating subsystem and direct the plurality of light beams to intersect at the object plane of the objective lens subsystem.

In some embodiments, at least one beam-conditioner in the plurality of beam conditioners can be a polarizer, an attenuator, and/or a phase shifter.

In some embodiments, the beam-generating subsystem can include a wavefront-dividing configuration (e.g. Lloyd's minor) to generate the plurality of light beams. In some embodiments, the beam-generating subsystem can include a beam-splitting configuration to produce the plurality of light beams.

The interference projection exposure system can also include an automatic alignment controller that adjusts the alignment of the pattern mask. In some embodiments, the interference projection exposure system can have a second objective lens subsystem, having a second image plane, second objective lens, and a beam splitter, wherein the beam splitter is located between the pattern mask and the objective lens and reflects a portion of the plurality of beams from the beam-providing subsystem to the second imaging plane such that monitoring and adjusting the alignment of the pattern mask can be conducted at the image plane of the second objective lens subsystem.

In some embodiments, the interference projection exposure system can also have an immersion fluid with a refractive index greater than unity located between the objective lens and the image plane.

Another exemplary embodiment of the present invention is a method of producing a high-spatial-frequency periodic optical-intensity distribution, by providing a plurality of light beams with a beam-providing subsystem, transmitting the plurality of light beams to an objective lens subsystem, and directing the plurality of light beams in the objective lens subsystem such that the plurality of beams to intersect and interfere at the image plane and produce the high-spatial-frequency periodic optical-intensity distribution. The objective lens subsystem can be an object plane, an objective lens, and an image plane configured to receive the plurality of light beams from the beam-providing subsystem such that the plurality of light beams intersect at the object plane of the objective lens subsystem between the beam-providing subsystem and the objective lens.

In an embodiment of the present invention, the method also includes selectively removing or altering a functional element pattern from the periodic optical-intensity distribution with a pattern mask located at the object plane of the objective lens subsystem.

In another embodiment of the present invention, the method of producing high-spatial-frequency periodic optical-intensity distribution can include a plurality of collimated light beams. In some embodiments, the plurality of beams may diverge or converge at the image plane of the objective lens in order to produce a periodic lattice with gradually changing periodicity.

Another exemplary embodiment of the present invention is a method of producing high-spatial-frequency periodic optical-intensity distribution, where the beam-providing subsystem can have a beam-generating subsystem configured to generate the plurality of light beams, a beam-conditioning subsystem comprising a plurality of beam-conditioners and configured to receive the plurality of light beams from the beam-generating subsystem; and a beam-directing subsystem comprising a plurality of beam-directing elements and configured to receive the plurality of light beams from the beam-generating subsystem and direct the plurality of light beams to intersect at the object plane of the objective lens subsystem. In an embodiment, the at least one beam-conditioner in the plurality of beam conditioners can be a polarizer, an attenuator, and/or a phase shifter. At least one beam-conditioner can be configured to produce a predetermined polarization, amplitude, and/or phase.

In an embodiment of the present invention, the beam-generating subsystem used in the method can include a wavefront-dividing configuration (e.g. Lloyd's minor) to generate the plurality of light beams. In another embodiment, the beam-generating subsystem used in the method can include a beam-splitting configuration to produce the plurality of light beams.

In an embodiment of the present invention, the method of producing high-spatial-frequency periodic optical-intensity distribution can also include monitoring and adjusting the alignment of the pattern mask with respect to the lattice of motifs at the objective lens image plane. The adjusting the alignment of the pattern mask can be by automatic feedback control. In an embodiment, the method can include a second objective lens subsystem, comprising a second image plane, second objective lens, and a beam splitter, such that the beam splitter located between the pattern mask and the first objective lens reflects a portion of the plurality of beams from the beam-providing subsystem to the second imaging plane, and monitoring and adjusting the alignment of the pattern mask is conducted at the image plane of the second objective lens subsystem, in parallel with the formation of the high-spatial-frequency pattern at the image plane of the primary objective lens.

DETAILED DESCRIPTION

Figure 1:
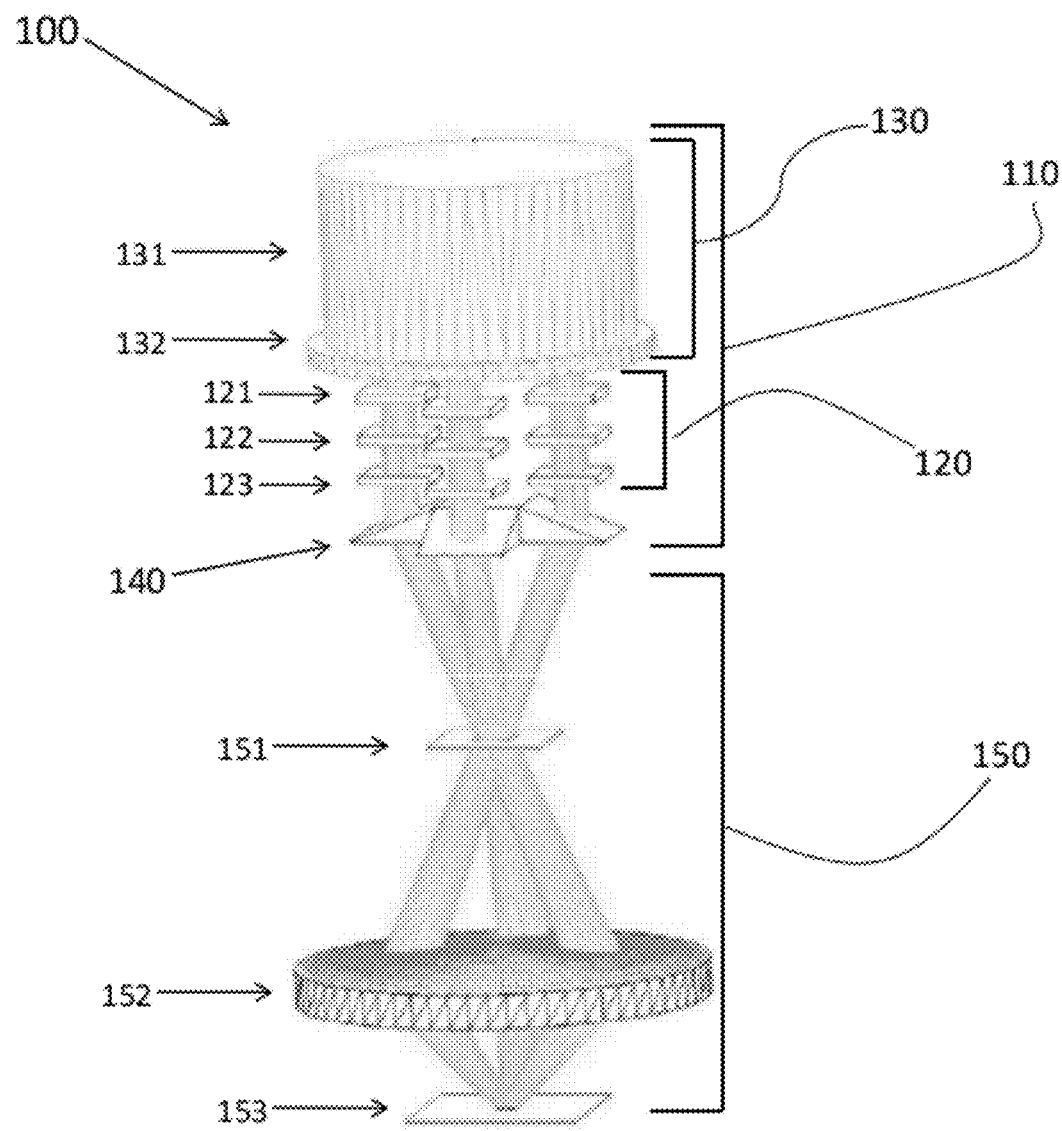
FIG. 1 illustrates an interference projection exposure system in accordance with exemplary embodiments of the present invention.

To facilitate an understanding of the principles and features of the various embodiments of the invention, various illustrative embodiments are explained below. Although exemplary embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the exemplary embodiments, specific terminology will be resorted to for the sake of clarity.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the exemplary embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components other than those expressly identified.

The present invention provides for a single-step exposure system based on Multi-Beam-Interference Lithography (MBIL) and Projection Lithography (PL) that can produce integrated nano- and micro-scale functional elements through a combination of direct imaging and interference between beams derived from a single light source. Because the present invention can be conducted in a single exposure, the present invention saves time and resources in development and in fabrication. The present invention also can change the integrated pattern rapidly, such that a separate mask for each circuit pattern is no longer needed. The present invention can rely on MBIL periodic patterning for a large portion of the resulting pattern, thereby easing the diffraction limitations of using PL alone.

The present inventive apparatus and method for direct photolithographic projection exposure can be described by referring now to FIGS. 1-4, where exemplary embodiments of the present invention are illustrated.

In an exemplary embodiment of the present invention, an interference projection exposure system 100 illustrated in FIG. 1 has a beam-providing/illumination subsystem 110 and an objective-lens subsystem 150. The objective-lens subsystem receives a plurality of light beams from the beam-providing/illumination subsystem 110 that produce the plurality of light beams that can intersect and/or illuminate a pattern mask at an object plane 151 that is between the objective-lens 152 and the beam-providing/illumination subsystem 110. The objective lens 152 is configured to receive the plurality of light beams so that the plurality of light beams intersect and interfere at the image plane 153 and produce a high-spatial-frequency periodic optical-intensity distribution. The objective lens 152 is further configured to project an image of the pattern mask at an object plane 151, effectively eliminating or altering portions of the periodic optical-intensity distribution at locations corresponding to functional elements.

The beam-providing/illumination subsystem 110 in FIG. 1 is depicted as having 3 light beams. The plurality of light beams can include two light beams, three light beams, four light beams, five light beams, and so forth, up to N light beams. Two light beams can be used to fabricate a one-dimensional structure. Three light beams can be used to fabricate a two-dimensional structure. Three dimensional structures can be achieved using four light beams, and more complex periodic structures can be achieved using larger number of light beams, up to N light beams.

The image plane 153 is depicted as a flat surface in FIG. 1, but can include any object, material or device one of ordinary skill in the art would use in a photolithographic system. In an embodiment, the image plane 153 can contain a substrate at which the light beams intersect and interfere. This substrate can be a substantially planar object in a three-beam exposure, such as a semiconductor surface for patterning. However, the substrate can also be a larger three-dimensional structure, as could occur when the plurality of light beams is four or more beams. The image plane can contain an imaging device, for example, a CCD camera, for recording the image produced by the interference system.

The objective lens 152 can be any combination of lenses, reflective surfaces, or other optical elements known to one of ordinary skill in the art that can direct a plurality of light beams to intersect and interfere at the image plane 153. In an embodiment, the objective lens can focus an integrated mask pattern and MBIL beams on a photosensitive material at the image plane. With a reproduction ratio of 1:1, the imaging by the lens can be free of coma, distortion, and lateral chromatic aberration. In addition to a reproduction ratio of 1:1, the reproduction ratio can be some other value such as 2:1 or 10:1, and values inbetween, based on the focal length and location of the objective lens between the pattern mask and the recording substrate. In an embodiment the objective lens 152 depicted in FIG. 1 can be a compound-lens system (e.g. Cooke triplet), a minor-based system (e.g. Schwarzschild objective), or any other configuration for focusing the MBIL beams and projected mask image down to resolutions below 100 nm. In an embodiment, the single-lens system depicted in FIG. 1 can be replaced by a Fourier transform pair of lenses, allowing filtering in the Fourier plane.

Figure 2:
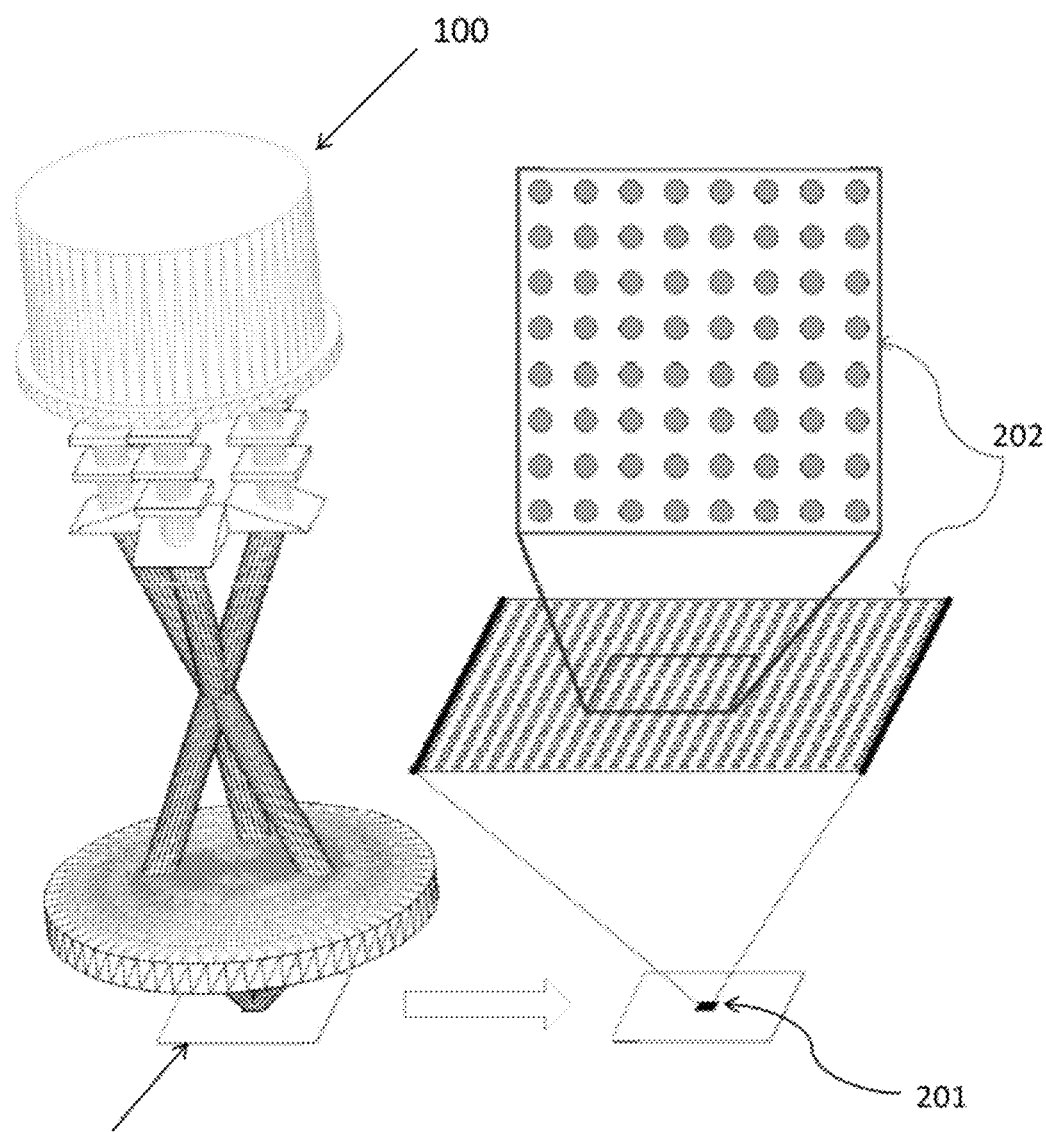
FIG. 2 illustrates an interference projection exposure system including a substrate in accordance with exemplary embodiments of the present invention.

The interference projection exposure system of the present invention can produce a high-spatial-frequency periodic optical-intensity distribution at the image plane by the intersection and interference of the plurality of light beams. As shown in FIG. 2, the interference projection exposure system 100, having an image plane 153, can produce a high-spatial-frequency periodic optical-intensity distribution 202 in or on a substrate 201 that is present in image plane 153. The optical-intensity distribution can contain a large area of repeating points, optionally called lattice points or motifs, in or on the substrate. The repeating points occur with a high-spatial frequency and can be characterized as an all-surrounding repeating structure. The repeating points can be either a minimum or a maximum height or depth in the substrate. The lattice points in the high-spatial-frequency periodic optical-intensity distribution can have a very short repeat distance, optionally called periodicity or lattice constant, between points or a longer repeat distance between points.

In an embodiment, the high-spatial-frequency periodic optical-intensity distribution can be varied in terms of periodicity, translational symmetry, and geometry. Periodicity, also identified as lattice constants, can be varied by changing the wavelength of the interfering beams and the angle of incidence of the interfering beams with respect to the image plane. The translational symmetry, also identified as the crystal structure, can be varied by arrangement of the wavevectors of the beams. The geometry, also identified as space group symmetry and motif geometry, can be varied by adjusting the beam amplitudes, phases, and polarizations.

In an embodiment, the object plane 151 can include a pattern mask. The interference projection system 100 illustrated in FIG. 3 has in the object plane 151 a pattern mask 301. The projected mask image can effectively block, occult, or alter portions of the plurality of light beams, thereby preventing or altering the formation of selected portions of the high-spatial-frequency periodic optical-intensity distribution. The interference and intersection of the plurality of light beams at the image plane 153, after passing through the pattern mask at the object plane, can produce the high-spatial-frequency periodic optical-intensity distribution 302 with integrated non-periodic functional elements at position corresponding to the pattern mask features. The pattern mask can be any pattern mask known to one of ordinary skill in the art. The pattern mask can serve in a similar manner as conventional masks in modern photolithography. As an alternative to a conventional mask, the pattern mask can be a photographic plate reticule or a spatial-light modulator capable of feature size resolutions in the micron range.

Figure 4:
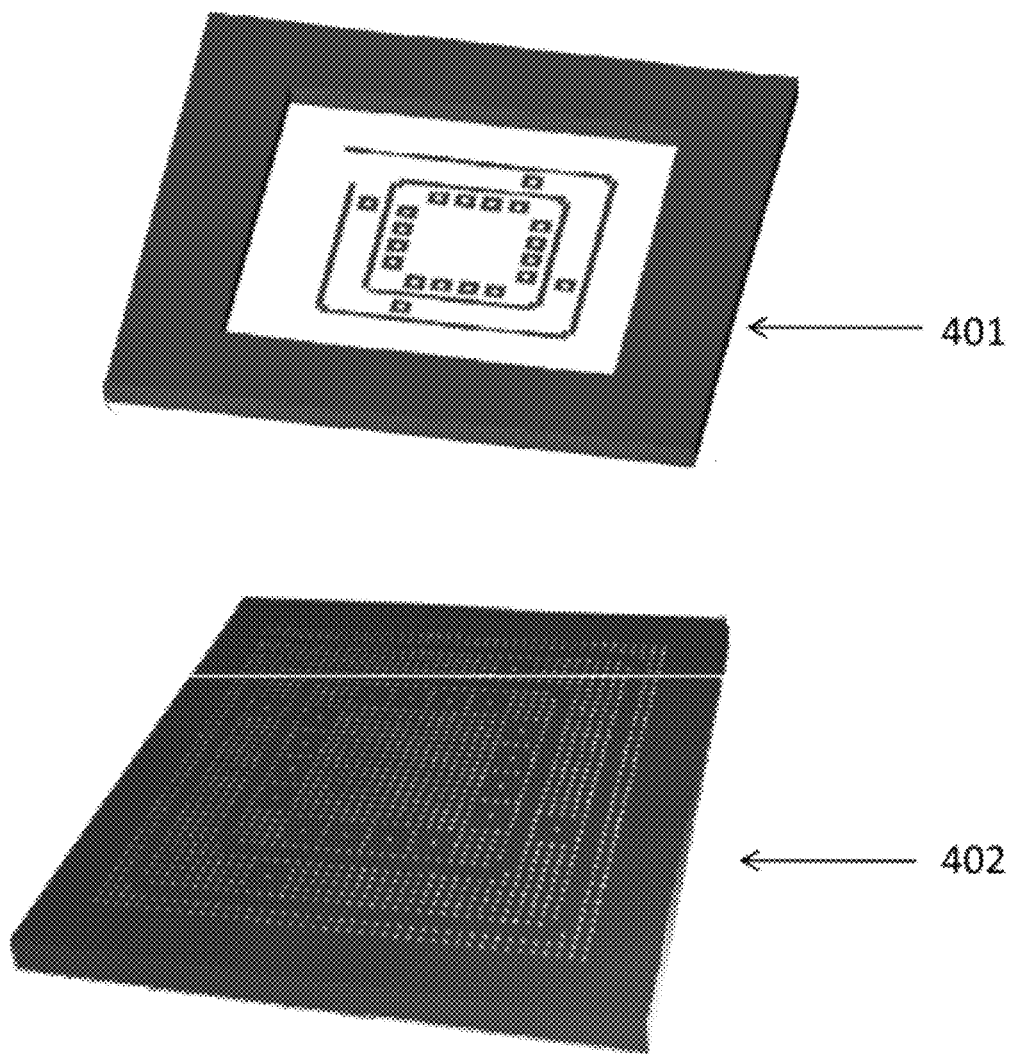
FIG. 4 illustrates a pattern mask and an optical-intensity distribution in accordance with exemplary embodiments of the present invention.

In an embodiment of the present invention, the pattern mask can effectively remove a non-periodic functional-element pattern from the high-spatial-frequency periodic optical-intensity distribution. The terms "high" and "low" in the spatial frequency should be understood to be relative terms, and do not include quantitative values of the numbers or density of lattice points in the optical-intensity distribution. The term "remove" as used herein can be synonymous with the terms "alter" or "eliminate" or "block." The pattern mask causes a portion of the lattice points or motifs to not form or to be altered in some functional manner. The number of points removed can be small compared to the overall high-spatial-frequency points. The pattern mask can create functional elements within the high-spatial-frequency periodic optical-intensity distribution, such as for example a photonic crystal waveguide or a ring resonator. The functional element pattern in the pattern mask 301 can be observed in the formation of the optical-intensity distribution 302. In another example, FIG. 4 illustrates another pattern in a pattern mask, 401, that can be observed in the formation of the optical-intensity distribution recorded in the photosensitive material 402.

Figure 3:
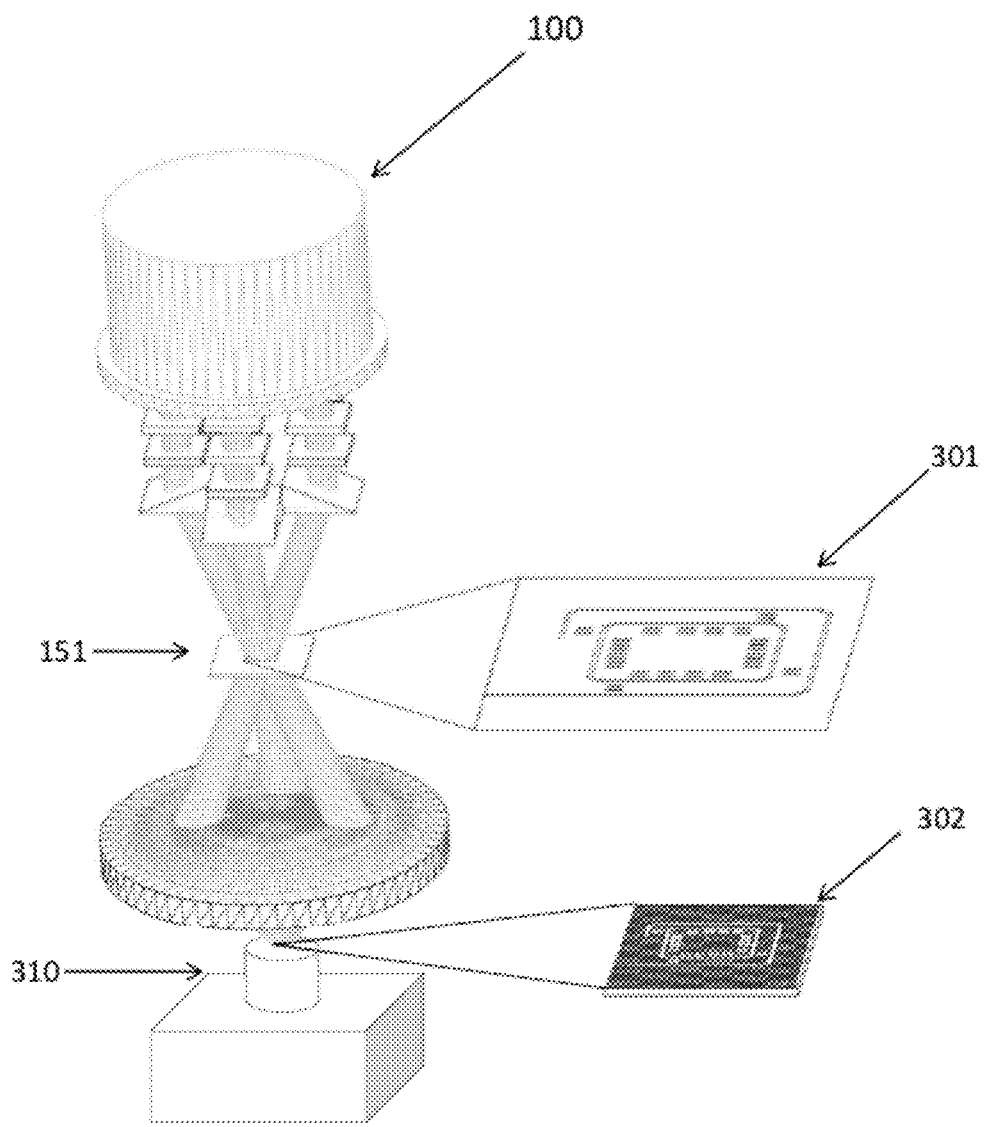
FIG. 3 illustrates an interference projection exposure system including a pattern mask in accordance with exemplary embodiments of the present invention.
Figure 5:
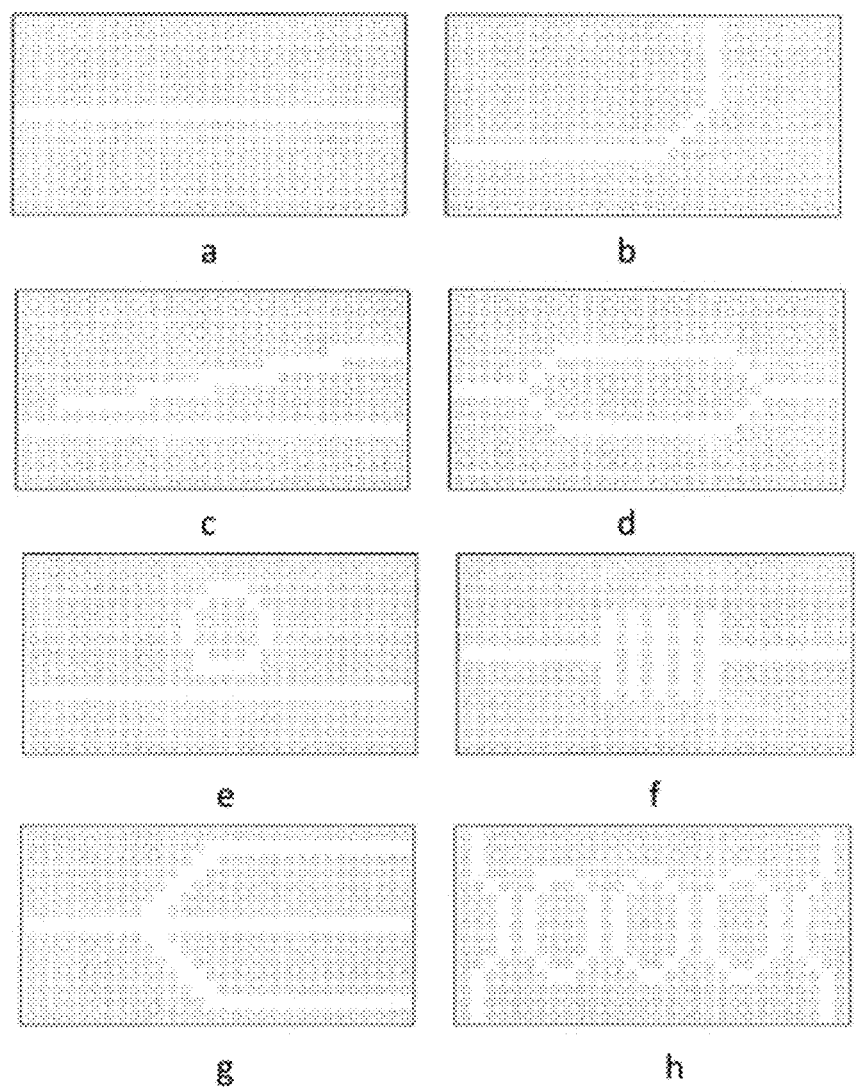
FIGS. 5 (a)-(h) illustrate examples of photonic crystal device patterns that can be prepared in accordance with exemplary embodiments of the present invention.

In an embodiment, the present invention combines the pattern mask blocking image with the MBIL interference pattern and projects both onto the substrate, effectively integrating the desired mask pattern with the lattice defined by the interfering beams as depicted in FIG. 3. Examples of photonic crystal device patterns that can be prepared are shown in FIG. 5, including (a) a waveguide, b) a ninety-degree waveguide bend, c) a directional coupler, d) a Mach-Zehnder interferometer, e) a ring resonator, f) a wavelength selective grating, g) a one-to-three splitter, and g) a resonant filter. The pattern mask can be mounted on a translation/orientation stage at the object plane, which allows the integrated pattern to be aligned with respect to the lattice formed by the interfering beams. This alignment can be monitored at the image plane with the imaging system 310 depicted in FIG. 3. In addition to the imaging configuration shown in FIG. 3, a beam splitter can be added between the objective lens and the object plan so that the integrated pattern can be imaged and aligned with the lattice in parallel with the exposure process. This alignment operation can be accomplished by automatic feedback control or by human adjustment.

Conventional photolithographic chromium masks typically contain linear features five to ten times larger than the final image projected onto the substrate at the image plane. The pattern mask 301 in FIG. 3 is twice as large as the projected image 302, matching the reproduction ratio of 2:1. Larger reproduction ratios and correspondingly smaller image feature resolutions are possible. In an embodiment, the reproduction ratio can be between 1:1 and 10:1. The image of the integrated pattern needs to contain adequate high-spatial-frequency components in order to be sufficiently sharp and clear to remove selected portions of the high-spatial-frequency periodic optical-intensity distributions without affecting substantially the surrounding periodic distribution. The numerical aperture of a diffraction-limited lens, source wavelength, and other process dependent factors can determine the maximum spatial-frequency components that will be transmitted and included in the image. Without adequate numerical aperture and aberration correction, the image may not contain the necessary sharp boundaries for the integrated pattern features. Thus a suitably aberration-corrected lens with sufficiently large numerical aperture can be used. However, it should be noted that a degraded image of the integrated pattern can be compensated partially or entirely by using a photosensitive material with a suitable nonlinear response to exposure or a circuit design with sufficient insensitivity to design parameters.

In an exemplary embodiment, the beam-providing/illumination subsystem 110 in FIG. 1 can contain three additional subsystems. The beam-providing/illumination subsystem 110 can contain a beam-conditioning subsystem 120, a beam-generating subsystem 130, and a beam directing subsystem 140. The beam-conditioning subsystem can be made up of beam conditioners 121, 122, and 123, which condition the plurality of light beams that originate from the beam-generating subsystem 130. The plurality of light beams can then be directed by the beam directing subsystem 140 to intersect at and/or illuminate the object plane 151.

The beam conditioners of the present invention can be any type of material known by one of ordinary skill in the art to be used to condition a light beam in a lithographic system. The beam conditioner can be a polarizer, an attenuator, or a phase shifter. In an embodiment, the device of the present invention can have at least one polarizer, attenuator, and/or phase shifter. Each light beam in the plurality of light beams can be conditioned in the same way, or each light beam can be conditioned in a different way from the other light beams. A set of adjustable attenuators, polarizers, and phase shifters can be present for each individual beam. The attenuator and polarizer can adjust the individual beam amplitude and polarization in order to optimize and define the resulting lattice geometry of the interference pattern. The phase shifters can be used to finely adjust the orientation and translation of the resulting interference pattern at the object plane. This orientation can be monitored with an imaging system that views the image of the interference pattern at the image plane as depicted in FIG. 3. The orienting operation can be accomplished by automatic feedback control or by human adjustment. After the interference pattern orientation is adjusted, the pattern mask of the integrated pattern can be inserted at the object plane 151.

The beam-directing subsystem of the present invention can be any type of beam directing element known by one of ordinary skill in the art. In an embodiment, the beam directing subsystem can include a prism or a series of mirrors. In an exemplary embodiment, the beam directing subsystem can be prism. In another exemplary embodiment, the beam directing subsystem can include a condenser lens system. Each beam-directing element can be adjusted individually to direct the each individual light beam in the plurality of light beams to the object plane. The beam-directing subsystem and the beam-defining mask, discussed below, can define the resulting incidence angles of the interfering beams at the image plane, and thereby control the periodicity or lattice constants, as discussed above. The beam-directing components can be adjusted by automatic feedback control or by human adjustment.

The beam-generating subsystem 130 in FIG. 1 can receive light 131 from a light generation source. The light generation source can be any source known to one of ordinary skill in the art. In an embodiment, the light source can be a lamp, a laser or other optical source. The light 131 interacts with the beam-defining mask 132 to produce the plurality of light beams. In an exemplary embodiment, the beam-generating subsystem can consist of an beam-splitting configuration in place of the beam-defining mask, consisting of beam-splitters, prisms, or diffractive elements.

In one preferred embodiment, the light generation source is a laser. The source wavelength, $\lambda$, can be chosen in order to satisfy specific design and fabrication requirements. Specifically, the spacing between the interference pattern lattice points (points of intensity pattern maxima/minima) is directly proportional to the wavelength of the interfering beams. For example, in FIG. 2, the spacing between two-dimensional photonic crystal lattice of rods is approximately $1.5\lambda$. The choice of source wavelength can also satisfy the photosensitive recording material requirements at the substrate. For example, while many photoresists have been designed for operation at 365 nm, common semiconductor photolithography techniques can utilize 193 nm wavelength light, with ongoing efforts to utilize increasingly shorter wavelength sources to reduce feature size.

In an embodiment, the plurality of light beams from the beam-generating subsystem can be a plurality of collimated light beams. A collimated light beam can maintain coherence more easily using a single unexpanded beam configuration. In another embodiment, the beam-generating subsystem can be a series of individual beams derived from a single unexpanded beam with the use of beam-splitters and minors similar to a conventional MBIL beam-defining mask. Energy utilization may be more efficient with this unexpanded beam configuration.

The beam-defining mask 132 can be any type of beam-defining mask used by one of ordinary skill in the art. The beam-defining mask can also be referred to as multi-beam-interference-lithographic-beam-defining mask, or MBIL beam-defining mask. In an embodiment, the beam-defining mask can have apertures that allow the light beams to pass through the mask. The number of beams produced by the beam-defining mask can be equal to the number of apertures. Apodized apertures can be used in place of conventional beam apertures in the MBIL beam-defining mask. In another embodiment, the MBIL beam-defining mask can be a spatial-light modulator, such as for example a liquid-crystal spatial-light modulator or electro-optic spatial-light modulator. The beam-defining mask can serve at least two key purposes. First, the positioning of the center of the apertures can define the incidence angles of the individual recording beams at the substrate, which, in turn, can define the resulting lattice structure, or periodicity, of the interference pattern. Based on the incidence angles, as well as the intensities and polarization of each beam, all two-dimensional and three-dimensional Bravais lattices and 9 of the 17 plane group symmetries may be produced. Further, these same parameters serve to define the shape (e.g. ellipticity, squareness, etc.) of the lattice point intensity minima/maxima profiles.

The interference projection exposure system of the present invention can provide for several advantages. The system can enable rapid prototyping for research and development and can facilitate rapid large scale manufacturing of advanced materials. Once fabricated, the pattern mask can be used multiple times, and if a spatial-light modulator is used in the pattern-mask plane, time consuming mask production can be eliminated. The system can be used to fabricate one-dimensional gratings (two beams), two-dimensional structures (three beams), and three-dimensional structures (four beams). The system can also accommodate N beams for more complex periodic structures. Example structures can include but are not limited to: a) square, hexagonal, rhombic, parallelogramic, or oblique lattices of pins, rods or holes; b) fluidic channels that can be straight or zig-zag or can have connections with adjacent channels; and c) arrays of pins used for optical and/or electronic interconnects in nano- and microelectronics. The apparatus and method can be used to fabricate arrays of circular holes used for etching optical/electronic vias. The apparatus and method can be used to make general-purpose and customized two-dimensional diffraction gratings with independently tailored horizontal and vertical diffraction characteristics. Such diffractive devices could be used as beam splitters, filters, back-lighting elements, CD head tracking devices, and for other applications. For example, the present invention can be used to prepare the diffractive photo-masks as described in co-pending U.S. patent application Ser. No. 13/250,011, filed on 30 Sep. 2011 by the inventors of this application, the disclosure of which is incorporated herein in its entirety as if fully set forth herein. The apparatus and method can eliminate a major obstacle to achieving dense integrated patterns with one-, two-, and three-dimensional period structures.

The interference projection exposure system of the present invention has the potential to produce a transformative impact on at least five broad fields: 1) micro- and nano-electronic integrated circuits, 2) photonic crystal devices, 3) metamaterial devices, 4) biomedical structures, and 5) subwavelength elements. The system can enable both rapid prototyping and access to large-scale manufacturing of these devices and structures in all these fields.

As discussed earlier, modern integrated circuits have very regular layouts with an underlying grid pattern that defines the smallest feature size in the integrated circuit. Multi-beam interference lithography (MBIL) can be used to define this underlying grid. MBIL immediately has the advantages of 1) simple optics, 2) large working distances, 3) high-speed processing, 4) low cost, and 5) extendable to higher resolutions. As such, MBIL could be a cornerstone for future optical lithography systems. The flexibility of interference lithography to produce maskless high-spatial-frequency periodic patterning, combined with other lithographic techniques (e.g. projection lithography, e-beam lithography, self-assembly), should play a key role in sustaining the demands of the microelectronics industry to reduce feature size with simple, inexpensive, large-area periodic nanoscale patterning. For example, interference lithography has been combined with optical contact lithography to fabricate triple-gate metal-oxide-semiconductor field effect transistors (MOSFETs). Similarly, interference lithography was recently used for metal thin film patterning in order to fabricate the electrodes and metallization patterns required by modern microelectronic devices.

Photonic Crystal (PC) technology has many important possible commercial applications. The technology potentially offers lossless control of light propagation at a size scale near the order of the wavelength of light. This technology has the potential to produce the first truly dense integrated photonic circuits and systems (DIPCS). Individual components that are being developed include resonators, antennas, sensors, multiplexers, filters, couplers, and switches. The integration of these components would produce DIPCS that would perform functions such as image acquisition, target recognition, image processing, optical interconnections, analog to digital conversion, and sensing. Further, the resulting DIPCS would be very compact in size and highly field-portable. Applications using light at telecommunications wavelengths require structures to be fabricated with nano-sized dimensions. Despite the advantages and benefits of using such a technology in commercial devices, there is a major problem: the practical commercial development of PC structures has been very slow.

Research has not fully developed a methodology for the large-scale, cost-effective integration of the PC-based devices into manufacturable DIPCS. The interference projection exposure system of the present invention can overcome this deficiency. As early at 1997, interference lithography was used to produce two-dimensional and later three-dimensional photonic crystal structures exhibiting a photonic bandgap. Since then, MBIL has been extensively studied, optimized, and used to fabricate photonic crystals with ongoing efforts to develop PC-based devices. When combined with direct laser writing, the design rules for MBIL defined photonic crystal waveguide devices have been theoretically defined. Recently, nanoscale photonic-crystal-band-edge lasers have been fabricated with the use of interference lithography, paving the way for the integration of electrically-driven PC lasers. Other proposed PC-based devices relying on MBIL include optical add-drop multiplexers (OADMs), organic light emitting diodes (OLEDs), coupled PC resonator arrays, and PC distributed feedback quantum cascade lasers Current developments in metamaterial (MM) technology potentially have many important commercial applications. This technology offers the control of light propagation at a size scale much smaller than the wavelength of light. Ultracompact objective lenses, frequency-doubling devices, parametric amplifiers, electromagnetic cloaking, and parametric oscillators all become possible with metamaterials. The integration of these components would produce DIPCS that are very compact in size and highly field-portable.

In natural materials (as contrasted to MM's), atoms are arranged in a periodic arrangement with periods of approximately half of a nanometer. In these natural materials, the electric field component of the incident light excites the electric dipoles of the material. These dipoles re-radiate with some phase retardation. Thus, the electric relative permittivity $\in r$ is not equal to unity. In contrast to this, the magnetic dipoles do not appreciably interact with the magnetic field component of the incident light. Thus the relative magnetic permeability $\mu r$ is unity. Metamaterials overcome this lack of magnetic dipole through subwavelength-sized artificial magnetic dipoles (e.g. split-ring resonator structures). The index of refraction, in general, is $n = \pm (\in r \; \mu r)^{1/2}$. For the case when both $\in r$ and $\mu r$ are less than zero, the refractive index is negative. That is, $n = -(\in r \mu r)^{1/2}$. It is not $n = +(\in r \mu r)^{1/2}$.

The subwavelength-sized magnetic dipoles needed to make an MM, can be produced by making microscopic split-ring resonators (SRR's). These SRR devices have also been called "slotted-tube resonators" or "loop-gap resonators" in the literature. If SRR devices are produced in subwavelength arrays, they behave as "magnetic atoms" and thus metamaterials become possible. Metamaterials have been successfully developed at microwave frequencies. However, the production of MM's at optical frequencies has been much more challenging. Further, current technologies lack the ability to rapidly produce these precise nanostructure devices at low cost. Again, MBIL provides a potential solution to this critical shortcoming. In order to produce a large area split-ring array (SRA) template for magnetic metamaterials, MBIL has been proposed as a mechanism to form single-slit and double-slit SRAs in two-dimensional triangular and square lattice arrays. Others have used MBIL to experimentally demonstrate high-throughput fabrication of metal-dielectric-metal "magnetic atoms" as well as cylindrical nanoshell, U-shaped, and double-split ring resonator array metamaterials. In some cases, MBIL may be used in conjunction with other methods to facilitate the economical fabrication of metamaterials. For example, interference lithography can be used to form a one-dimensional array of trenches to serve as a template for the self-directed assembly of a silver nanocluster metamaterial.

Biomedical structures that are periodic or quasi-periodic in one-, two-, and three-dimensions are critically important in a wide variety of areas. Some representative example applications are described here to enable gauging the impact that they have in biomedicine. In regenerating nerves, arrays of microchannels are needed to guide nerve growth. In facilitating bone regrowth, periodic meshes are needed to retain and sequester bone morphogenetic protein. This biomaterials process reduces protein dose by localizing the morphogenetic stimulus. In the forming, maintaining, and repairing of tissue, engineered surfaces are needed that present controlled densities of peptides to direct assembly of extracellular matrices. In measuring the strength of cell adhesion to the extracellular matrix, meshes are needed to control the size and position of cells in order to be able to determine the individual contributions of the various structures present. In identifying genetic biomarkers for human disease, high density microarrays are needed for the detection of dozens of polymorphisms in a single analysis. For example, 11 micron square positions are used so that highly redundant oligonucleotide probes can ensure robustness. In studying the functions of a cell (gene expression, adhesion, migration, proliferation, and differentiation), micropatterning of the cells is needed since the cell functions are affected by the microscale and nanoscale environment. In enhancing bone formation in vivo, it is necessary to microstructure the titanium implant surfaces. For example, 100 micron cavities are found to produce osteoblast attachment and growth. In the controlled delivery of insulin, a permeable membrane mesh is needed that allows insulin and nutrients to pass through while blocking larger immune cells, T-cells, and antigen-presenting cells.

These biomedical applications all require appropriate periodic or quasi-periodic structures that can be made by MBIL. This fact has led several to turn to MBIL for numerous biomedical applications in recent years. In order to immobilize proteins in a square array of anchor sites, nano-scale lattices were formed by interference lithography. This application will assist in the analysis of biomaterials and the study of interactions of living cells with biomolecules. In the development of neural prosthetic devices, phase mask interference lithography was used to fabricate three-dimensional hydrogels with controlled geometries and sub-micron feature sizes. This application could lead to advances in drug delivery, tissue engineering and improved material-device interactions. In the field of antibacterial research, MBIL was used to create a two-dimensional pore-array to immobilize silver nanoparticles, known for their antibacterial properties. In a study of this application, the fabricated antibacterial nanocomposition proved effective against the *E. coli* bacteria. Based on these recent examples, MBIL could become an important tool in the development of the next generation of biomaterials and biomedical structures.

MBIL can be used to produce subwavelength periodic patterns produced by MBIL, and allow study and production of numerous important structures can be realized for a increasing number of applications, including synthesized-index elements, form-birefringent polarization elements, guided-mode resonant elements, field emission devices, plasmonic structures, surface texturing, magnetic nanostructures, and numerous other nanotechnology efforts.

Synthesized-index elements include one-dimensional and two-dimensional periodic surface structures for use as antireflection surfaces. Simple one-dimensional binary surface-relief gratings on dielectrics can exhibit zero-reflectivity at optical wavelengths. For example, interference lithography has been used to record subwavelength gratings on the surface of diffractive beam splitters, reducing surface reflections, thereby improving efficiency. Similarly, MBIL was used to fabricate subwavelength antireflective coatings to improve the performance of optoelectronic LEDs. Most recently, subwavelength antireflection patterns were recorded in a Si substrate using interference lithography, providing broadband (250-1200 nm), wide angle (0-45°) operation. Such antireflection surfaces have been extended to lossy, even metallic, materials. Two-dimensional crossed gratings have also been implemented to provide polarization-independent antireflection behavior mimicking the effect of a "moth's eye. Periodic and quasi-period surfaces have been widely applied to increase the efficiency of solar cells. To this end, interference lithography was recently used to fabricate antireflective gratings on thin-film solar cells. Other example application include, 100 nm period grating in an amorphous silicon thin film used to stabilize the linear polarization of VCSEL's operating at 850 nm, and a critical angle transmission (CAT) grating facilitated by the use of scanning beam interference lithography (SBIL).

Form-birefringent polarization elements include retardation plates, polarizers, and beam-splitters. Retarders can behave as quarter-waveplates, half-waveplates, full-waveplates, etc. and thus convert linearly polarized light to circular polarization, rotate linear polarization, provide narrowband filtering, etc. Subwavelength grating retarders have been made for use in the visible and in the infrared regions of the spectrum. Similarly, subwavelength-grating polarizers have also been designed and demonstrated. Two-beam interference lithography has been demonstrated as a highly cost effective fabrication process to generate these subwavelength structures.

Guided-mode resonant gratings are widely utilized for their very narrowband filter characteristics. Such subwavelength-grating filters represent important devices in dense-wavelength-division multiplexed communications and in chemical, biological, toxicological, and environmental sensing applications. Recently, broadband versions of these resonant gratings have also been demonstrated.

The process of field emission ejects electrons from a metal surface or a doped semiconductor material under the influence of an applied electric field. Traditionally, field emission is generated from micro-structured tips used as the cathodes for electron extraction. Field emission devices have found applications in field emission displays (FEDs), vacuum microelectronics, satellite subsystems, mass spectrometers, and even electrodynamic space tethers. In order to improve FED performance and reduce manufacturing costs, high density microfield emitter arrays with submicron emitter spacing were fabricated using interference lithography. Recent efforts have focused on the use interference lithography, combined with catalytic etching, to produce the nanocones used in field emission, potentially eliminating the need for other more complicated lithography techniques. Others have employed MBIL to aid in the production of carbon nanotubes that could prove useful in field emission display applications.

Surface plasmon resonances occur for a range of frequencies when an electromagnetic field excites oscillations of free electrons on the surface of metallic nanostructures. Near-field coupling effects on the plasmon resonance of these metal nanostructures, called localized surface plasmons (LSP), can be used in biosensing applications, surface enhanced Raman spectroscopy (SERS), and novel photonic devices. The mechanism of plasmonic resonance is directly related to the refractive index variation in the metallic film nanostructures, commonly fabricated using self-assembly methods. However, this process is difficult and does not lend itself to commercial manufacturing. To this end, MBIL has been used as a mechanism to produce plasmonic metallic nanostructures including silver dot arrays, gold particle arrays, and bimetallic dot structures.

Magnetic nanostructures, often called "nanomagnets," have been proposed as an alternative technology for information storage. In this application, discrete nanomagnets with uniaxial magnetic anisotropy store binary information when magnetized in one of two possible antiparallel directions. In order to generate these magnetic nanostructures, interference lithography has been used to generate a nanoscale array of dots that are, in turn, transferred to a magnetic film using ion beam etching. Others have employed interference lithography in the fabrication of cobalt magnetic arrays for use in magnetic random access memory (MRAM) devices. Most recently, MBIL was used to create magnetic patterns in Co/Pd multilayer systems with favorable magnetic properties.

Surface patterning at the micro- and nano-scale has been the subject of much study, with applications across numerous areas, including microelectromechanical systems (MEMS), automotives, aviation, defense, and biological areas. Laser surface texturing (LST) using multi-beam interference is of interest to tribology technologies including textured surfaces for mechanical seals, piston rings, and thrust bearings. In one study, laser interference metallurgy (LIMET) was employed to improve lubrication film lifetimes and the tribological behavior of various surface textured materials. Others have studied the wetting properties and superhydrophobicity of surfaces, patterned by laser interference, for such applications as corrosion inhibition, microfluidic technology, self-cleaning window glass, and evaporation-driven nanopatterning. Similarly, interference patterning has been used to create biomemetic structures, mimicking natural sub-micron periodic patterns such as bone material, nacre and shells which exhibit advantageous mechanical stability and dynamic surface properties.

Multi-beam interference can be used to produce optical traps. Traditionally, optical trapping relies on the increased electrical field associated with the localized optical-intensity of a focused beam. A dielectric particle is, in turn, guided by this increased electric field force to the point of the highest light intensity. By this mechanism, optical traps have been used to manipulate a range of particles including polymer spheres, metallic particles, and biological specimens. Recently, techniques to manipulate suspended micro- and nano-scale particles have been realized through the use of holographic optical tweezers, trapping multiple objects simultaneously. In this application, the focused beams are replaced by computer-defined beam arrays generated by a spatial-light modulator (SLM). Using this method, sophisticated algorithms have been developed to provide updates to the computer generated hologram in order to control dynamically the orientation of the multiple trapped particles. Recently, this techniques was used to control and study rod-shaped bacteria and zeolite L crystals.

As an alternative to computer generated holographic optical tweezers, multi-beam interference may provide similar optical arrays along with dynamic control of light intensity and orientations in two- and three dimensions, easing the requirement for complicated computer control algorithms. Multi-beam interference optical trapping was first realized with a two-beam interferometric trap to hold polystyrene beads of a few microns in diameter. Later, two- and three-dimensional interference patterns were used to trap, sort and manipulate trapped particles on a small scale using focused interfering beams. Recently, large-area three-dimensional arrays of optical traps have been demonstrated through the use of multi-beam interference, without the need for iterative computational algorithms. The various embodiments of the present invention are further illustrated by the following non-limiting examples.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above-discussed embodiments, and should only be defined by the following claims and all equivalents.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. It is intended that the application is defined by the claims appended hereto.

EXAMPLES

Example 1

Figure 6:
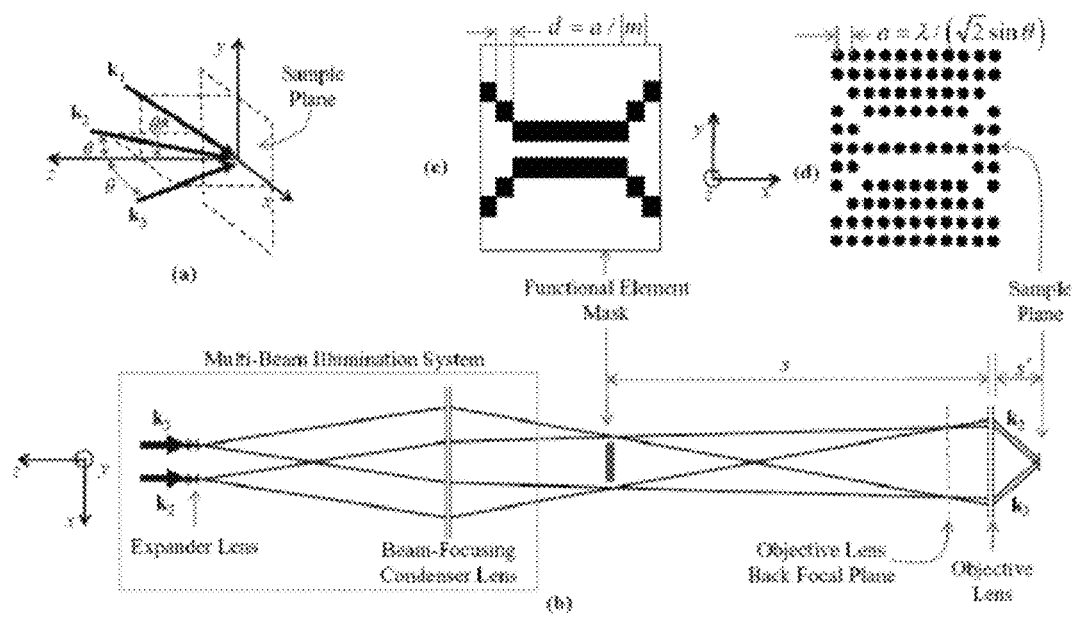
FIGS. 6 (a)-(d) illustrate aspects of an interference projection exposure system configuration in accordance with exemplary embodiments of the present invention.

A conceptual three-beam interference projection exposure system (IPES) configuration is depicted in FIG. 6. FIG. 6 shows a three-beam interference projection exposure system, including (a) the configuration of wavevectors $k_1$, $k_2$, and $k_3$, used to produce a square-lattice interference pattern with a lattice constant $a=\lambda/(\sqrt{2} \sin \theta)$; (b) a ray trace diagram that depicts the propagation of $k_2$ and $k_3$ through the multi-beam illumination system that ensures that the beams illuminate the functional element mask and focus at the back focal plane of the objective lens. The interfering beams are collimated and intersect at the sample plane at a distance s', forming an all-surrounding square-lattice pattern; (c) the functional element mask which is placed at a distance s from the objective lens with minimum mask features sizes of $d=a/|m|$, where $m=-s'/s$; and (d) the resultant optical-intensity distribution of low-spatial-frequency, non-periodic functional elements in an all-surrounding, high-spatial-frequency periodic square lattice to achieve single-exposure fabrication of a photonic crystal device.

The three beams depicted in FIG. 6a, represented by wavevectors $k_1$, $k_2$, and $k_3$, required to produce a square-lattice interference pattern at the sample plane. FIG. 6 b depicts a ray trace of $k_2$ and $k_3$ ($k_1$ is not shown for clarity). As the beams propagate through the multi-beam illumination system, they are focused at specific locations at the back focal plane of the objective lens by proper placement and spacing of the expander lens and beam-focusing condenser lens. This ensures that the interfering beams are collimated by the objective lens and intersect at the sample plane at a distance s' with the required incidence angle, θ, thereby forming a uniform all-surrounding square-lattice optical-intensity distribution. As required by conventional projection lithography, the multi-beam illumination system also ensures that the beams intersect at the functional element mask, providing illumination of proper intensity, spectral characteristics, and field uniformity.

The IPES functional-element mask is located at a distance s from the objective lens as depicted in FIG. 6 c. The purpose of this mask is two-fold. First, the transparent areas of the mask allow the multiple beams to pass through and form the desired interference pattern at the sample plane. Second, the opaque areas of the mask block and diffract the illuminating beams, a portion of which is collected by the objective lens and focused at the sample plane. This projected mask image effectively occults the multiple interfering beams, preventing or altering the formation of portions of the interference pattern at areas corresponding to the functional elements defined by the mask features with minimum dimensions of approximately d=a/|m|. Here, m is the magnification and defined as −s'/s. The result is an optical-intensity distribution containing non-periodic elements and an all-surrounding, high-spatial-frequency, periodic pattern. This pattern may, in turn, be recorded on or in a photosensitive material incorporating the (non-linear) response with a single exposure to form functional devices, such as the photonic crystal waveguide coupler depicted in FIG. 6 d.

Figure 7:
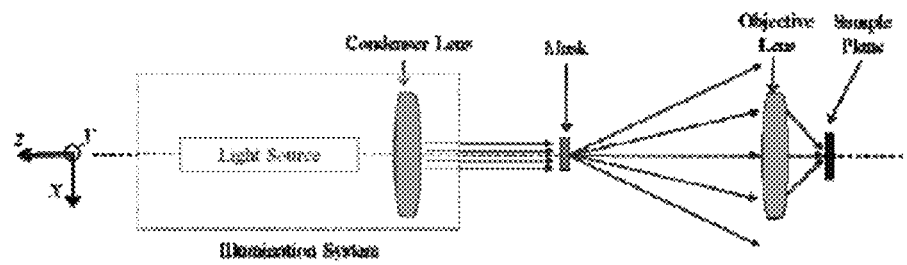
FIG. 7 illustrates a basic projection lithography system in accordance with exemplary embodiments of the present invention.

The design of the IPES configuration begins with a basic PL system as depicted in FIG. 7, which shows a basic projection lithography configuration in which the illumination system provides the required mask illumination to project a reduced image of the mask pattern on the sample plane. In this configuration, the illumination system consists of a light source and a condenser lens to provide mask illumination with proper intensity, spectral characteristics and field uniformity. The mask in this configuration is a transparent substrate with an opaque pattern that blocks and diffracts portions of the light from the illumination system. Finally, the objective lens collects a portion of the diffracted light and projects an image of the mask on the sample plane. In general, PL systems require an objective lens system with a large diameter to collect the diffraction pattern and a short focal length to reduce the pattern mask projected image size. Thus, a relatively large numerical aperture objective lens is preferred for the basic PL configuration.

Figure 8:
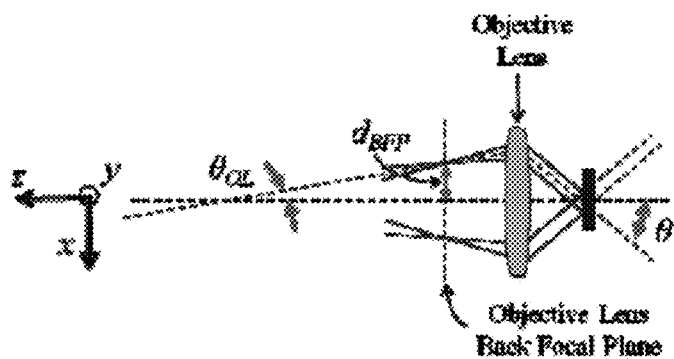
FIG. 8 illustrates objective lens configuration in accordance with exemplary embodiments of the present invention.

The design of the IPES system must also incorporate an MBI capability in conjunction with the basic PL configuration in FIG. 7. To ensure an interference pattern with uniform periodicity and sufficient area, the interfering beams should be collimated as depicted by the ray trace of $k_2$ and $k_3$ ($k_1$ is not shown for clarity) in FIG. 8. FIG. 8 shows an IPES objective lens design configuration, where the multiple beams are focused at the objective lens back focal plane to generate collimated beams. This ensures a large-area interference pattern with uniform periodicity at the sample plane. The angle of incidence at the sample plane, θ, is directly proportional to the beam displacement, $d_{BFP}$, and inversely proportional to the objective lens focal length. Here it is seen that collimated beams are produced when the individual beams are focused at the back focal plane of the objective lens. With collimated beams, the periodicity of the periodic pattern is inversely proportional to the incidence angle, θ. A general relationship for θ may be given by $$\theta \propto \frac{d_{BFP}}{f_{OL}} - \theta_{OL} \qquad \text{Eq. 1}$$

where $d_{BFP}$ is the radial distance of the focused MBI from the optical axis, $f_{OL}$ is the objective lens focal length, and $\theta_{OL}$ is the objective lens propagation angle with respect to the optical axis. From the relationship in Equation 1, it can be seen that the incidence angle, which determines the periodicity, is directly proportional to the beam displacement and inversely proportional to the objective lens focal length. As with the PL configuration, this relationship suggests that an objective lens with a large numerical aperture is desired for MBI patterning.

Figure 9:
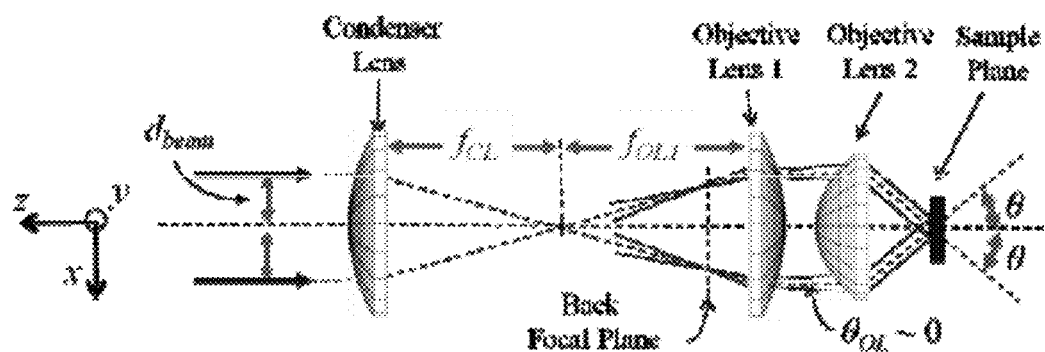
FIG. 9 illustrates two-lens objective lens configuration in accordance with exemplary embodiments of the present invention.

To improve image resolution, interference-pattern uniformity, and the range of possible lattice constants, a two-lens configuration was selected as depicted in FIG. 9. This allows the power of the objective lens system to be divided between two lenses, thereby increasing the maximum possible incidence angle, θ, while reducing lens aberrations. In fact, modern PL objective lens designs often include 15 or more low-power lens elements to minimize and cancel several common aberrations including spherical, coma, astigmatism, field curvature, and distortion. In this design, aspheric lens were selected for the two objective lenses to reduce longitudinal spherical aberration as depicted in FIG. 9. FIG. 9 shows the IPES spherical aberration correction for two axial beams, at a radial distance, $d_{beam}$, from the optical axis are incident on an aspheric lens, correcting for longitudinal spherical aberrations. The first aspherical objective lens is placed at a distance from the condenser lens such that the beams again propagate parallel to the optical axis ($\theta_{OL} \sim 0$). The beams are then focused by the second aspherical objective lens at the sample plane Aspheric lenses are designed specifically to provide a common focal point for axial rays, regardless of their radial position, thereby reducing off-axis aberrations. Accordingly, the compound objective lens design included the requirement that the beams propagate parallel to the optical axis at exit of the first objective lens and the entrance to the second objective lens, as indicated by the objective lens propagation angle, $\theta_{OL}$, in FIG. 9. Similarly, the design required that the beams incident on the condenser lens also be parallel to the optical axis. To satisfy these two conditions, the condenser lens and first objective lens are separated by the two lens focal lengths, $f_{CL}$ and $f_{OL1}$, as depicted in FIG. 9. In doing so, $\theta_{OL}$ is effectively reduced to zero in Equation 1, thereby simplifying the relationship to $$\theta \propto \frac{d_{beam}}{f_{OL2}}, \qquad \text{Eq. 2}$$

where $d_{beam}$ is the radial distance of the individual beams from the optical axis incident on the condenser lens, and $f_{OL2}$ is the focal length of the second objective lens.

Figure 10:
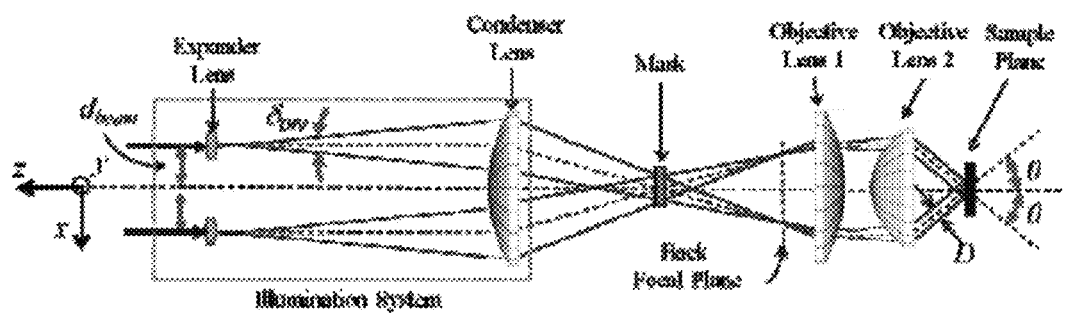
FIG. 10 illustrates a multi-beam interference projection lithography configuration in accordance with exemplary embodiments of the present invention.

To complete the basic IPES design and combine the multi-beam interference and PL systems of FIGS. 8 and 9, the multiple beams must be conditioned such that they focus at the back focal plane of the compound objective lens, while illuminating simultaneously the PL pattern mask as depicted in FIG. 10. FIG. 10 demonstrates a combined multi-beam interference and projection lithography configuration, where expander lenses are added to ensure that the multiple beams are focused at the back focal plane of the compound objective lens, while providing partially coherent illumination of the PL mask. This is accomplished through the selection and placement of one or more expander lenses prior to the condenser lens. The relationship between the diameter of the collimated beam, D, which determines the area of interference, and the divergence of the beam, $\delta_{DIV}$, at the objective lens back focal plane is given by $$D \propto \delta_{DIV} \propto \frac{1}{f_{EL}}, \qquad \text{Eq. 3}$$

where $f_{EL}$ is the effective focal length of the expander lens. The relationships given by Equations 2 and 3 both suggest that a large diameter lens is preferred for both the condenser lens and the first objective lens. However, the focal length of these two lenses may be longer to reduce the power, and therefore the aberrations of the IPES configuration.

Figure 11:
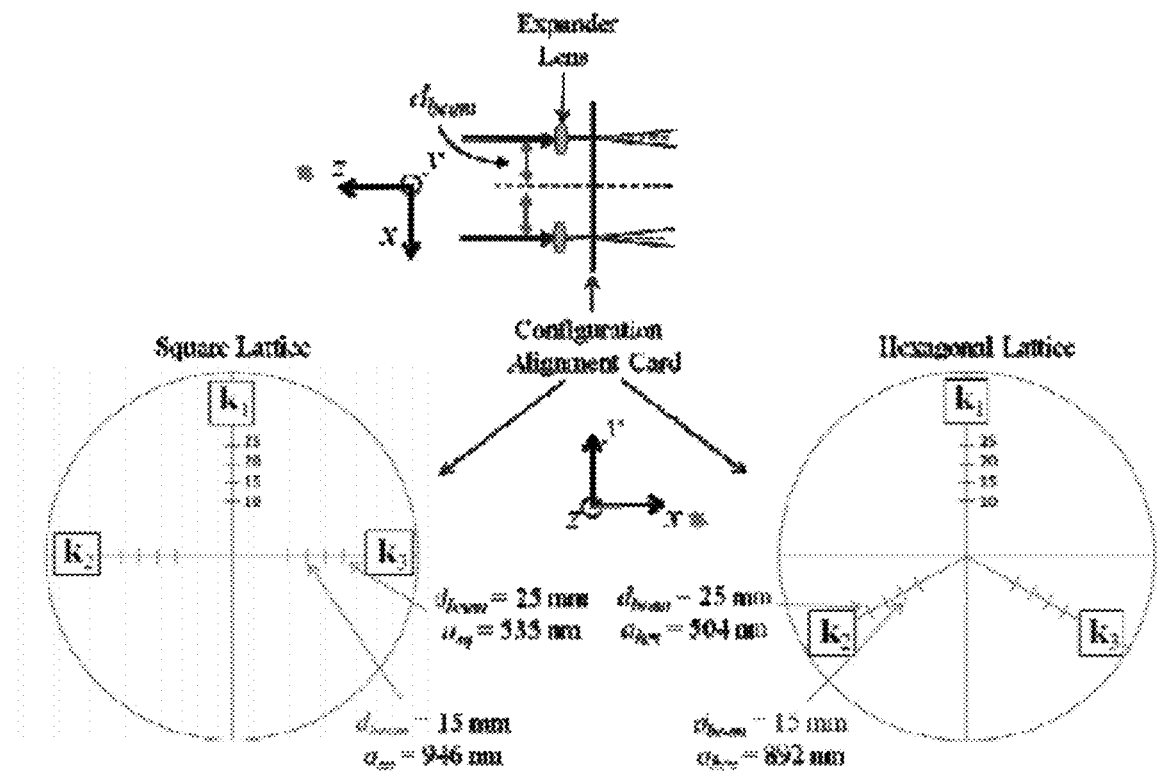
FIG. 11 illustrates an aspect of the interference projection exposure system configuration in accordance with exemplary embodiments of the present invention.

The IPES configuration of FIG. 10 allows for a wide range of lattice constants and translational symmetries that vary from square to hexagonal, as determined by the radial displacement and arrangement of the three beams with respect to the optical axis. The lattice constant may be increased or decreased by adjusting the radial distance of the individual beams from the optical axis. Similarly, the arrangement of the beams about the optical axis may be used to determine the translational symmetry. To facilitate the arrangement and displacement of the three beams, an alignment card may be placed at the focal point of the expander lens as depicted in FIG. 11 for a square lattice and a hexagonal lattice. An alignment card placed at the focal point of the expander lens is used to set the IPES wavevector alignment for square and hexagonal translational symmetry with a lattice constant inversely proportional to the radial displacement.

Figure 12:
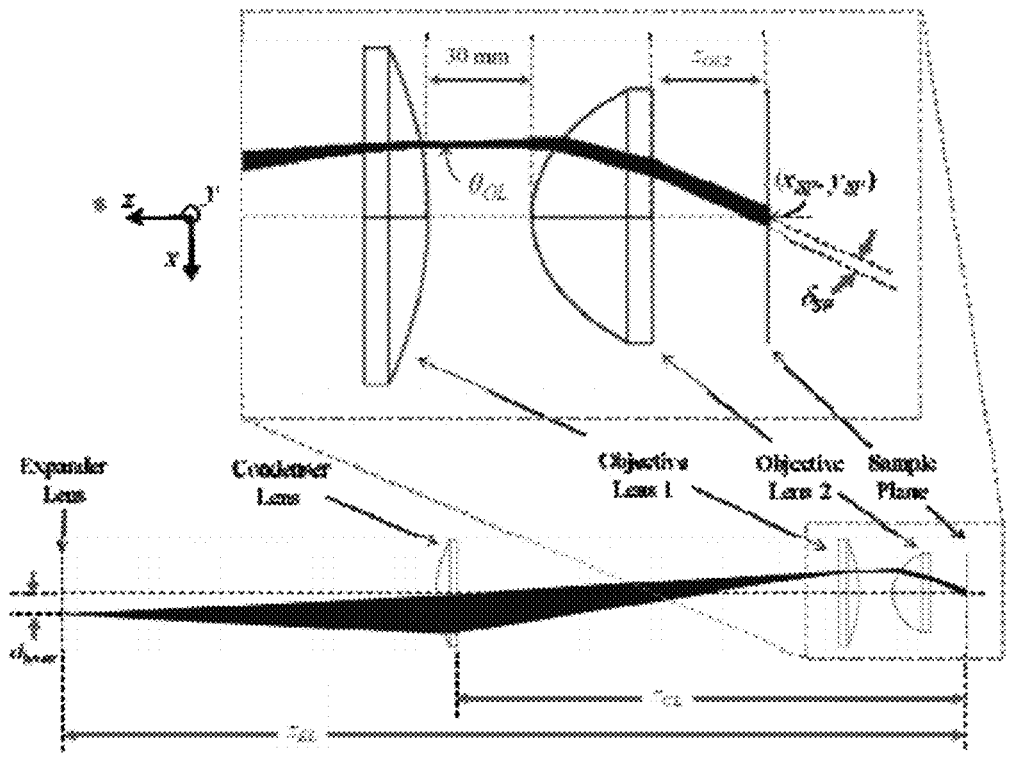
FIG. 12 illustrates an interference projection exposure system configuration in accordance with exemplary embodiments of the present invention.

The IPES configuration depicted in FIG. 10 was implemented in ZEMAX, an optical system design software, using the specifications for commercial large-diameter aspheric UV lenses. A Thorlabs 100 mm diameter, 200 mm focal length aspheric lens was selected for both the condenser lens and first objective lens. A Thorlabs 75 mm diameter, 60 mm focal length aspheric lens was selected for the second objective lens. All three lenses are fabricated from B270 crown glass and anti-reflection coated for 350-700 nm light. The three-lens IPES configuration is depicted in the ZEMAX 3D layout in FIG. 12 for a single beam. The inset in FIG. 12 depicts three of the key system parameters that are considered in the optimization of the system configuration, based on the preceding IPES design discussion. First, beam collimation is accomplished by minimizing the beam divergence, $\delta_{SP}$, at the sample plane. Next, the area of interference in maximized by adjusting the sample plane position to ensure the beam is centered on the x-y axis intercept when $x_{SP}$ and $y_{SP}$ are equal to zero. When multiple beams are present, this will maximize the area of intersection of the interfering beams. Next, the objective lens propagation angle, $\theta_{OL}$, is minimized to a target value of zero to reduce spherical aberrations. Finally, the desired angle of incidence at the sample plane, $\theta$, is set to the specific value as required for a specific lattice constant.

The ZEMAX optimization that used to determine the optimal IPES configuration employs a routine that seeks to find a local minimum for the merit function $$MF^2 = \frac{\sum W_i (V_i - T_i)^2}{\sum W_i}, \qquad \text{Eq. 4}$$

where W is the absolute value of the weight of the operand, V is the current value, T is the target value and i indicates the operand number. ZEMAX employs a root-mean-square algorithm by calculating the square root of the average value of the squares of the individual errors. Table 1 lists the operands that were included in the merit function to determine the optimal values for the second objective lens positions, $z_{OL2}$, the condenser lens position, $z_{CL}$, expander lens front focal plane position, $z_{ELffp}$, and required beam displacement, $d_{beam}$, as depicted in FIG. 12. FIG. 12 shows an IPES configuration with the parameters to be optimized via ZEMAX. The beam displacement, $d_{beam}$, the distance from the sample plane to the second objective lens, $z_{OL}$, the condenser lens, $z_{CL}$, and the expander lens, $z_{EL}$, are optimized for collimation ($\delta_{SP}=0$), objective lens propagation angle ($\theta_{OL}=0$), interference area ($x_{SP}=0$, $y_{SP}=0$), and wavefront spherical aberration. The target incidence angle, $\theta$, was selected to be 25.39 deg, corresponding to a 600 nm square-lattice constant.

The resulting optimized configuration parameters, $z_{OL}$, $z_{CL}$, $z_{EL}$, and $d_{beam}$, based on the operands in Table 1 are listed in Table 2. Opto-mechanical constraints fix the spacing between the two objective lenses at 30 mm as depicted in FIG. 12.

TABLE 1

| Merit Function Operand | Weight | Target Value | Optimized Value |
| --- | --- | --- | --- |
| Compound Objective Lens Wavefront Spherical Aberration | 0.25 | 0 | 7.11e-4 |
| Beam x-axis Intercept, $x_{SP}$ | 0.25 | 0 | 0.00 |
| Beam y-axis Intercept, $y_{SP}$ | 0.25 | 0 | -3.83e-8 |
| Maximum Beam Divergence at Sample Plane, $\delta_{SP}$ (deg) | 0.75 | 0 | 0.59 |
| Objective Lens Propagation Angle, $\theta_{OL}$ (deg) | 0.25 | 0 | 2.26e-6 |
| Beam Incidence Angle, $\theta$ (deg) | 0.25 | 25.39 | 25.39 |

TABLE 2

| IPES Parameter | Optimized Value |
| --- | --- |
| Second Objective Lens Position, $z_{OL2}$ | 33.92 mm |
| Condenser Lens Position, $z_{CL}$ | 476.67 mm |
| Expander Lens Position, $z_{EL}$ | 880.660 mm |
| Beam Displacement, $d_{beam}$ | 22.67 mm |

Figure 13:
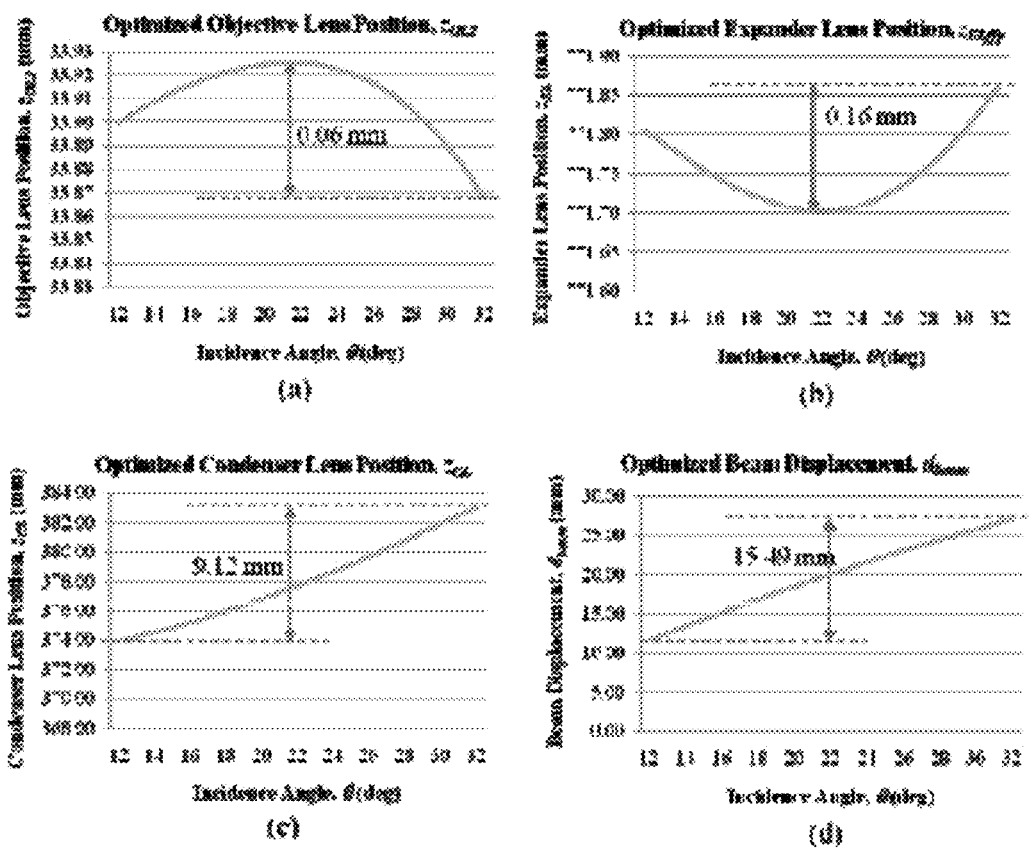
FIG. 13 (a)-(d) illustrate configuration parameters for an interference projection exposure system configuration in accordance with exemplary embodiments of the present invention.

Using the ZEMAX optimization routine described in the preceding section, the simulated IPES performance was analyzed for the full range of beam incidence angles, $\theta$, for both the square and hexagonal wavevectors. Physical constraints of the proposed opto-mechanical system limited beam displacement to a minimum value of approximately $d_{beam} \approx 11.5$ mm from the optical axis. This value results in a minimum incidence angle of approximately $\theta \approx 12$ degrees. Similarly, the clear apertures of the proposed large-diameter aspheric lenses limit the maximum beam displacement to $d_{beam} \approx 27$ mm, corresponding to a maximum incidence angle of $\theta \approx 31.5$ degrees. FIG. 13 shows the optimized IPES configuration parameters for incidence angles ranging from 12 to 32 deg., where (a) the optimal distance between the sample plane and the back surface of the second objective lens, $z_{OL}$, varies by 0.06 mm for the range of incidence angles; (b) the positioning of the condenser lens, given by $z_{CL}$, increases gradually by 9.31 mm; (c) the positioning of the expander lens, given by $z_{EL}$, increases gradually by 2.25 mm as the desired incidence angle increases; and (d) the beam displacement from the optical axis, $d_{beam}$, increases by 15.48 mm. From these plots it is noted that the objective lens position, $z_{OL}$, varies by only 0.06 mm. By contrast the optimal condenser lens position, $z_{CL}$, expander lens position, $z_{EL}$, and required beam displacement, $d_{beam}$, all increase as a function of $\theta$ by 9.31 mm, 2.25 mm, and 15.49 mm respectively. These results suggest that the objective lenses may be fixed at a median value while the condenser lens, expander lenses, and beam displacing optics require optimized adjustment for each desired lattice constant and translational symmetry. By fixing the distance between the sample plane and the compound objective lens, the pattern mask would also be fixed to ensure an optimally focused image at the sample plane according to the lensmaker's equation.

Figure 14:
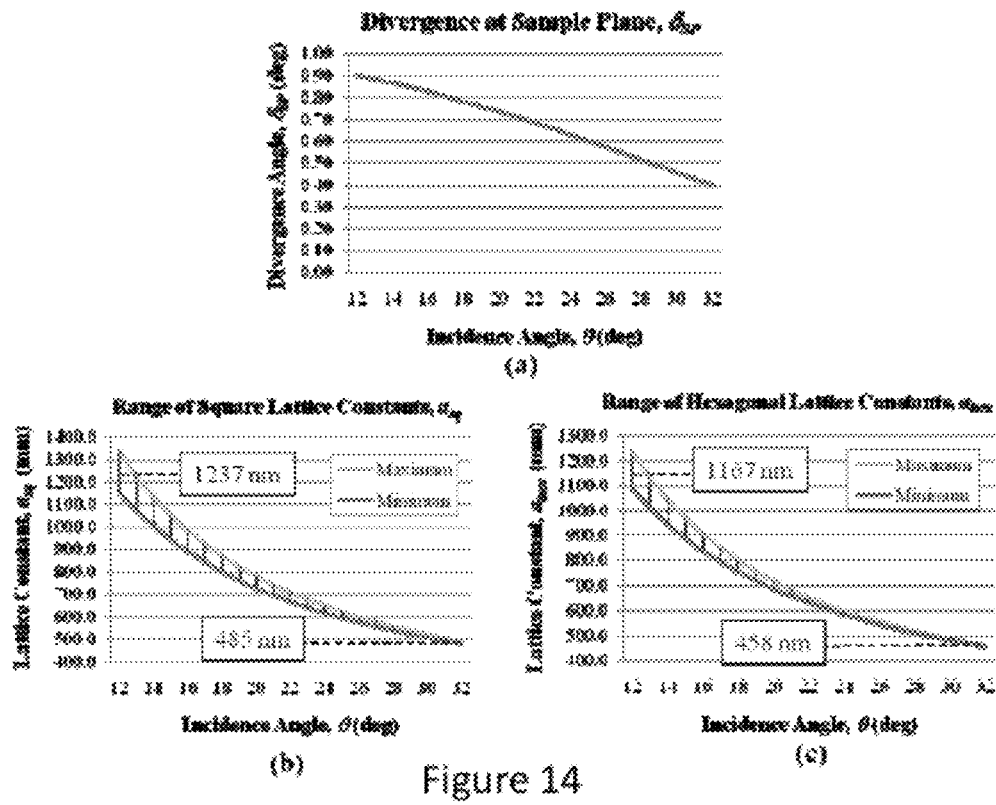
FIGS. 14 (a)-(c) illustrate lattice constants for configuration parameters of an interference projection exposure system configuration in accordance with exemplary embodiments of the present invention.

Using the ZEMAX optimization routine, an analysis of the IPES interference pattern was performed. Next, FIG. 14 depicts the range of lattice constants for the optimized parameters shown in FIG. 13, for the optimized IPES lattice constants for $12 \leq \theta \leq 32$ degrees, where (a) the beam divergence at the sample plane decreases as the incidence angles increase; (b) the range of square-lattice constants decreases from the maximum predicted design value of 1237 nm down to a minimum periodicity of 485 nm; and (c) the range of hexagonal-lattice constants decreases from the maximum predicted design value of 1167 nm down to a minimum of 458 nm. Here, the range of lattice constants is a product of the divergence angle of the beam at the sample plane, $\delta_{SP}$, as depicted in FIG. 14(a). For the range of square-lattice constants plotted in FIG. 14(b), the values are determined using the maximum and minimum incidence angles of the beam profile at the sample plane. Similarly, the minimum and maximum hexagonal lattice constants are determined and plotted in FIG. 14(c). A maximum range of lattice constants occurs at the smallest incidence angle, corresponding to the largest possible lattice constants. For a square lattice, the range of lattice constants at $\theta=12$ deg is approximately 1152 nm to 1336 nm. At this same angle of incidence the hexagonal-lattice constants vary from 1086 nm to 1260 nm. The minimum range, suggesting the most uniform interference-pattern periodicity, occurs at the largest incidence angles. At $\theta=32$ deg, the lattice constants ranging from 480 nm to 491 nm for the square lattice and 453 nm to 463 nm for the hexagonal lattice. Finally, the predicted full range of design lattice constants is 485 nm to 1237 nm for a square lattice and 458 nm to 1167 nm for a hexagonal interference pattern. The predicted results suggest that the IPES prototype configuration will be capable of producing a wide range of PC lattices.

Figure 15:
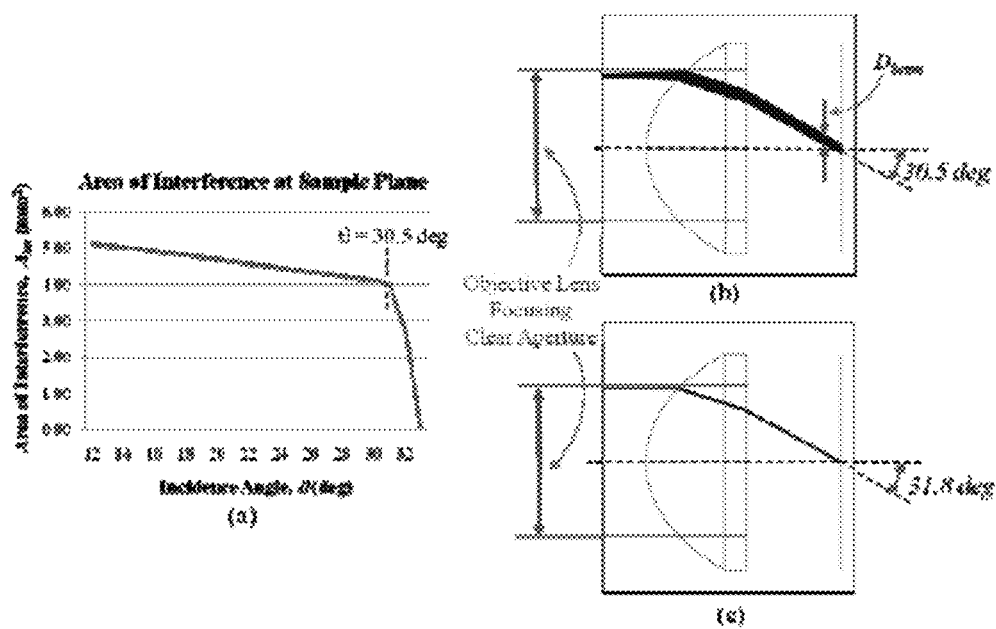
FIGS. 15 (a)-(c) illustrate predicted areas of interference for an interference projection exposure system configuration in accordance with exemplary embodiments of the present invention.

Next, FIG. 15(a) depicts the predicted area of interference at the sample plane as a function of the desired incidence angle for an optimized IPES area of interference at sample plane for $12 \leq \theta \leq 32$ degrees. A relatively large area of interference of greater than 4 mm² is possible for incidence angles up to 30.5 deg. In FIG. 15 (b), clear aperture limitations begin to restrict the incident beam diameter incident on the second objective lens and in FIG. 15 (c), the maximum allowable incidence angle reaches a limit at approximately 32 degrees.

Therefore, at approximately 30.5 degrees, the area of interference begins to drop off sharply. This is due to the objective lens clear aperture limitation for focusing. This limitation requires the beam diameter to be reduced for larger incidence angles corresponding to the beam displacement from the optical axis as depicted in FIGS. 15 (b) and (c). In the actual opto-mechanical configuration, an aperture after the expander lens may be used to reduce the beam diameter. This, in turn, reduces the beam diameter at the sample plane, $D_{beam}$, resulting in a reduced area of interference.

Figure 16:
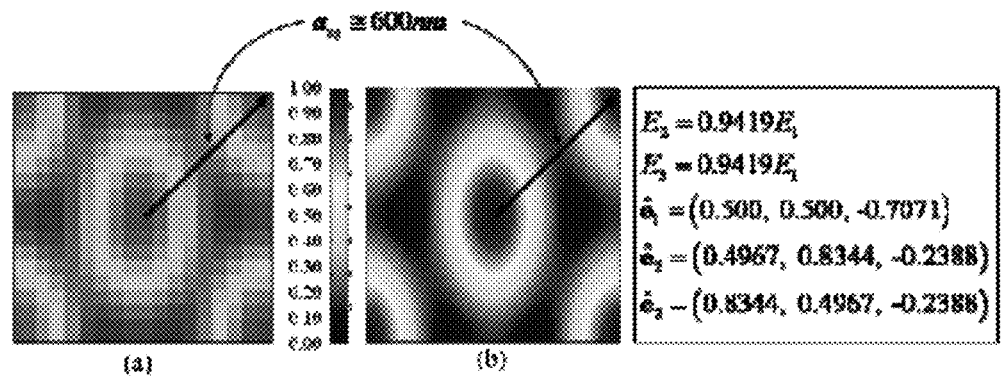
FIGS. 16 (a) and (b) illustrate simulated interference pattern for an interference projection exposure system configuration in accordance with exemplary embodiments of the present invention.

The resulting interference pattern simulated in ZEMAX is depicted in FIG. 16, where in (a) the ZEMAX simulation produces a square-lattice interference pattern with a 600 nm lattice constant for an incidence angle of $\theta=25.39$ deg, and in (b) the same pattern is simulated with MATLAB, optimized for the cmm plane group symmetry where each interference coefficient is equal in magnitude. Here, the pattern is optimized for cmm plane group symmetry ($|a|=|b|$, $V_{12}=V_{13}=V_{23}$), where each beam-pair produces interference fringes with equal contrast. This result confirms that ZEMAX does not take into account polarization in the formation of an interference pattern, modeling the interference of any two beams with a common contrast. For this reason, the ZEMAX interference-pattern simulation cannot predict accurately the plane group symmetries or precise motif geometries for individual beam-set polarizations and amplitudes. However, ZEMAX may be used to verify the desired translation symmetry and periodicity of the resulting interference pattern.

Figure 17:
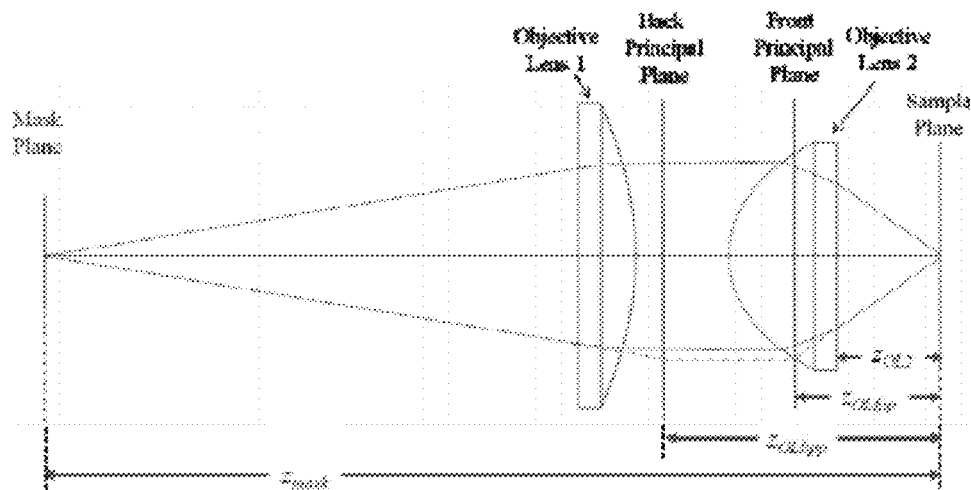
FIG. 17 illustrates a model of the objective lens for an interference projection exposure system configuration in accordance with exemplary embodiments of the present invention.

To determine the compound objective lens parameters and analyze the projection imaging capabilities, the compound objective lens was modeled in ZEMAX as depicted in FIG. 17 using the optimized IPES configuration parameters listed in Table 2. The resulting compound objective lens parameters and required mask position, $z_{mask}$, are presented in Table 3.

TABLE 3

| Objective Lens Parameters | Value |
| --- | --- |
| Front Principal Plane Position, $z_{OLfpp}$ | 65.01 mm |
| Back Principal Plane Position, $z_{OLbpp}$ | 79.89 mm |
| Effective Focal Length, $f_{OL,eff}$ | 49.86 mm |
| Mask Position, $z_{mask}$ | 293.86 mm |
| Numerical Aperture, NA | 0.60 |
| Reduction Ratio | −0.30 |

To optimize the imaging capabilities of the IPES system, the wavefront spherical aberration was minimized in the merit function as discussed earlier. The ZEMAX calculated value for this parameter is given by $$\frac{S_1}{8}, \quad \text{Eq. 5}$$

where $S_1$ is the first Seidel aberration coefficient. The longitudinal sperical aberation is then determined by $$\frac{S_1}{2n'u'^2}, \quad \text{Eq. 6}$$

where n' is the index and u' is the slope of the ray after passing through the last surface of the system. The resulting optimized compound objective lens longitudinal spherical aberration is plotted in FIG. 18 (a) for $12 \leq \theta \leq 32$ degrees, where the longitudinal spherical aberration decreases to a minimum value of approximately 10 µm as the angle of incidence increases.

Figure 18:
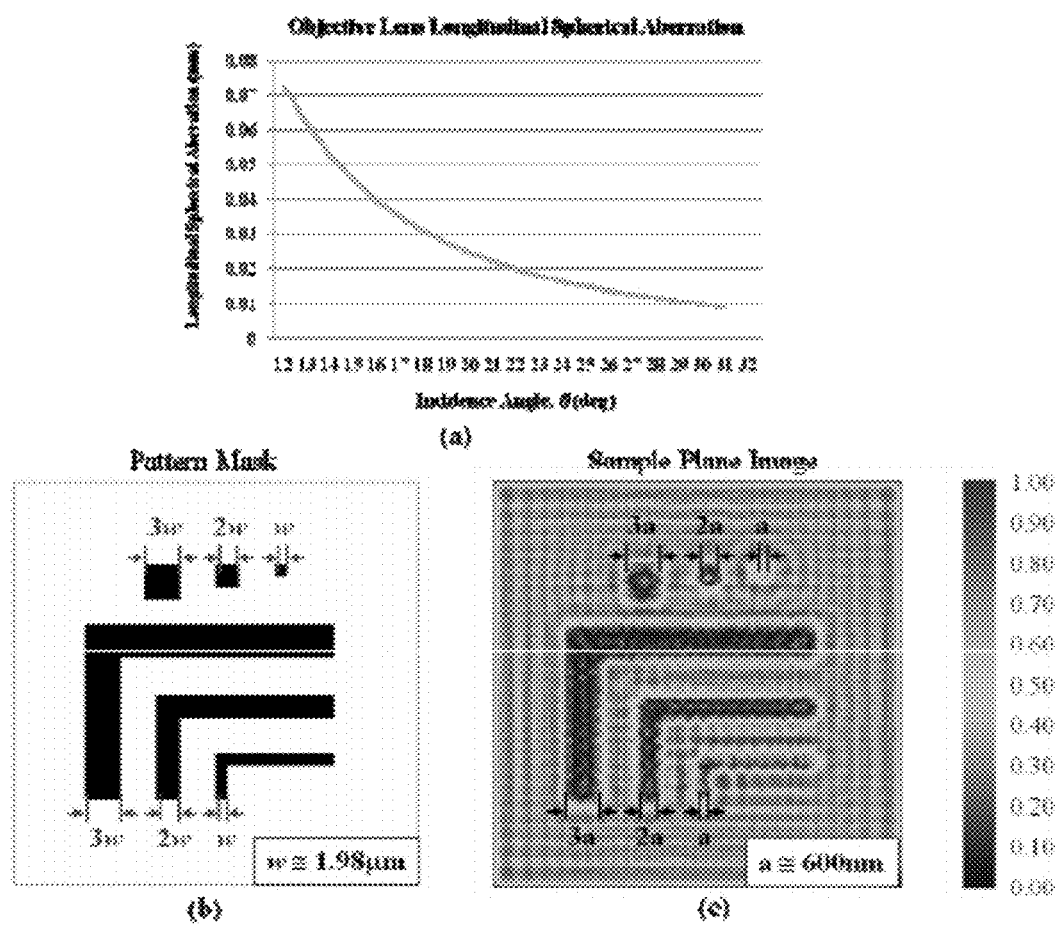
FIGS. 18 (a)-(c) illustrate aspects of an interference projection exposure system configuration in accordance with exemplary embodiments of the present invention.

To understand the significance of the spherical, as well as the other optical system aberrations, FIG. 18 (b) depicts the ZEMAX simulated coherent image formed at the sample plane for a mask image with a single square pixel and linear features with 90 degree bends, ranging in size from 1.98 to 5.94 µm. With a compound objective lens reduction ratio of −0.30, the projected image features range in size from 600 nm to 1.8 µm, matching the square-lattice constant of 600 nm depicted in FIG. 16.

In forming the predicted coherent image, ZEMAX conducts a Fourier analysis of the complex system optical transfer function, accounting for the finite pass band and other diffraction-related effects of the real optical system. This method assumes a single extended coherent illumination source and approximates the coherent transfer function to form the predicted image. Together, the predicted interference pattern in FIG. 16 (a) and the predicted coherent image in FIG. 16 (c) provide a general confirmation of the IPES capabilities. However, ZEMAX does not provide a means to model partially-coherent, multi-beam, off-axis mask illumination to simulate the IPES ability to produce an interference pattern with integrated functional elements defined by the mask image.

An initial prototype IPES configuration was constructed and tested. The system was configured using the parameters developed in the preceding section for three-beam square-lattice patterning with an approximate lattice constant, $a_{sq}$, of 600 nm. The initial beam displacement, $d_{beam}$, was set at approximately 22.6 mm using the alignment card in FIG. 11 (a). The mask used for the initial demonstration consisted of a 32×32 square-lattice array of opaque 100 µm circles with 400 µm periodicity as depicted in FIG. 19 (a).

Figure 19:
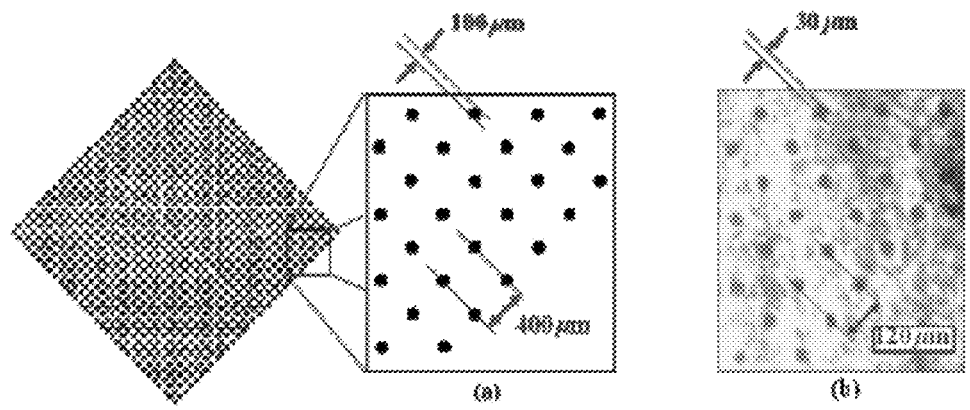
FIGS. 19 (a) and (b) illustrate a pattern mask and image for an interference projection exposure system in accordance with exemplary embodiments of the present invention.

A 3.2 Megapixel Olympus Q-Color3 Imaging System digital charge-coupled device (CCD) camera was placed at the sample plane to capture the projected mask image as depicted in FIG. 19 (b). The projected mask circular features were measured at approximately 30 µm with a periodicity of 120 µm based on a reduction ratio of 0.3.

Figure 20:
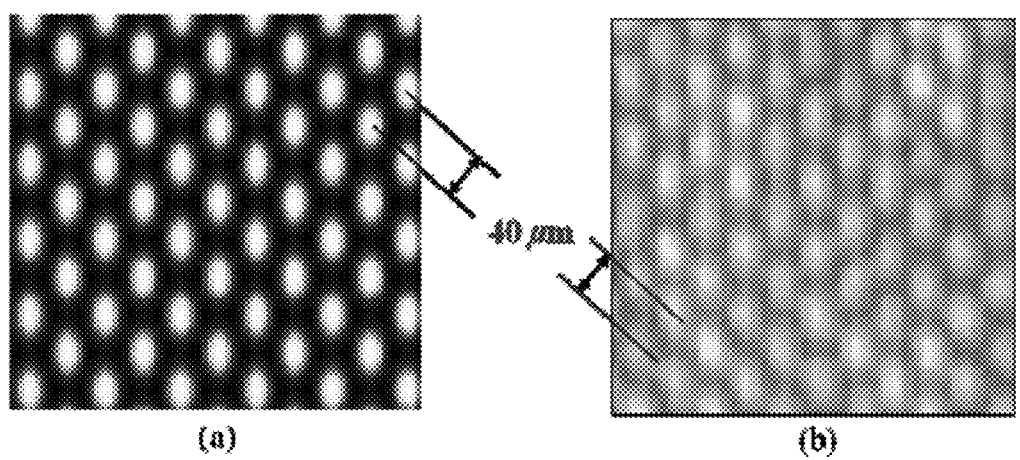
FIGS. 20 (a) and (b) illustrate a theoretical and CCD image of an interference pattern in accordance with exemplary embodiments of the present invention.

For this configuration, a 60×Newport microscope objective was placed at the intersection of the three interfering beams such that the beams entered at the front lens assembly, serving to enlarge the interference pattern. The CCD camera was then placed at the exit of the objective lens allowing for real-time monitoring of the resulting interference pattern. A MATLAB simulation depicts the predicted square-lattice interference pattern based on a 0.4 deg incidence in FIG. 20 (a) and a CCD image of the actual IPES interference pattern is depicted in FIG. 20 (b).

Example 2

Figure 21:
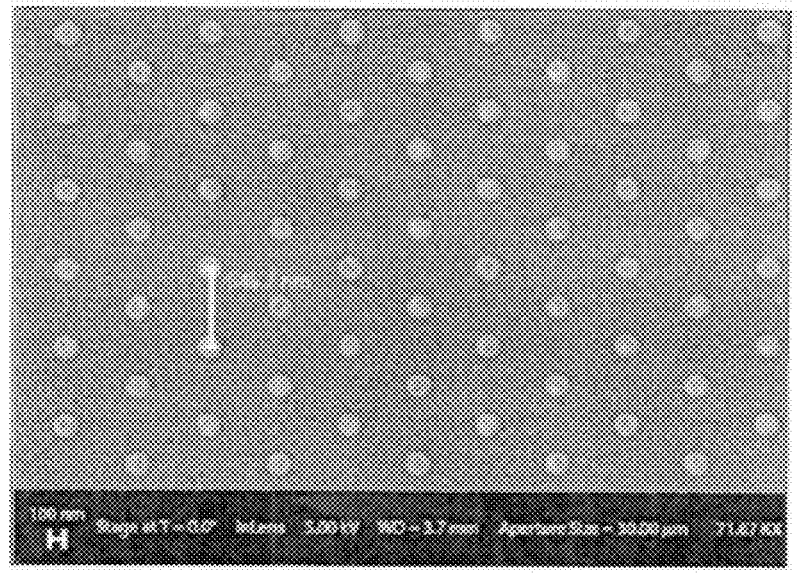
FIG. 21 illustrates a SEM image of a photonic crystal lattice that can be fabricated in accordance with exemplary embodiments of the present invention.
Figure 22:
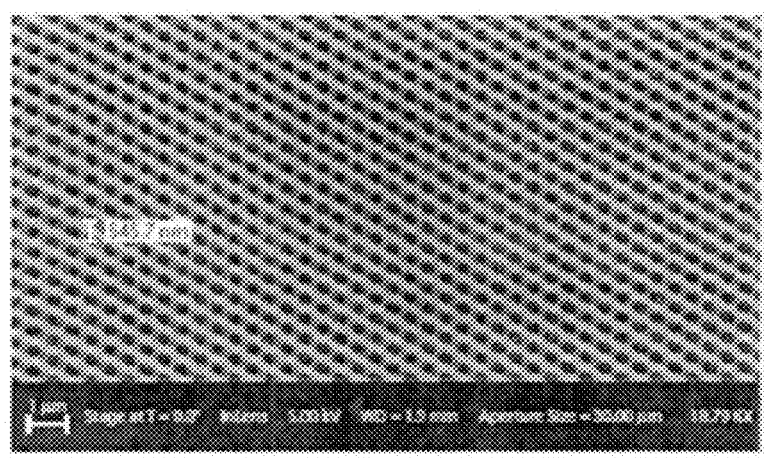
FIG. 22 illustrates a SEM image of a photonic crystal lattice that can be fabricated in accordance with exemplary embodiments of the present invention.
Figure 23:
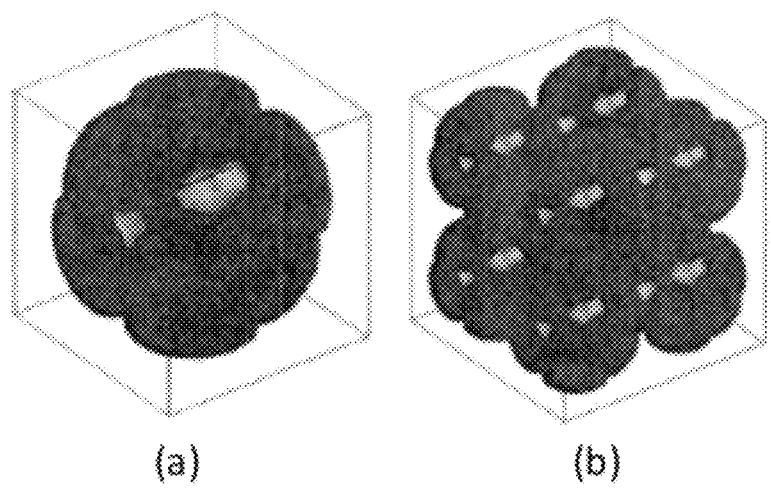
FIGS. 23 (a) and (b) illustrate examples of three-dimensional metamaterials that can be fabricated in accordance with exemplary embodiments of the present invention.
Figure 24:
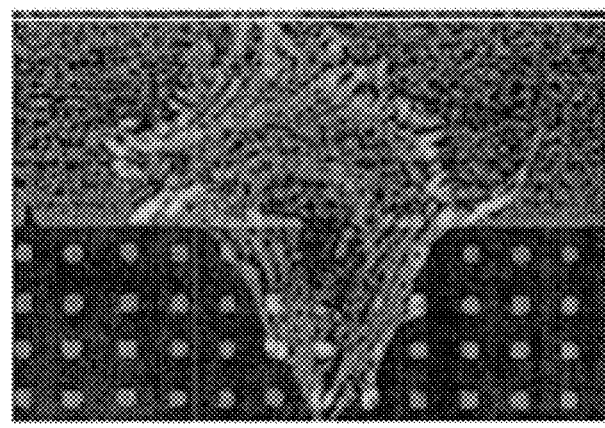
FIG. 24 illustrates an example of a biomedical extracellular matrix that can be fabricated in accordance with exemplary embodiments of the present invention.

FIGS. 21 and 22 provide examples of photonic crystal lattices of pins and holes that can be made using a source wavelength of 363.8 nm at an incidence angle of 26.39° for each interfering beam at the substrate recording plane. FIG. 23 provides an example of a three-dimensional metamaterial structure at the micron scale that can be made, while FIG. 24 depicts a biomedical structure with lattice spacing on the order of 100 nm that can be made.

What is claimed is:

1. An interference projection exposure system comprising:
 a beam-providing subsystem configured to provide a plurality of light beams; and
 an objective lens subsystem comprising an object plane, an objective lens and an image plane, the objective lens subsystem configured to receive the plurality of light beams from the beam-providing subsystem such that the plurality of beams intersect and interfere at the image plane to produce a periodic optical-intensity distribution, wherein the plurality of light beams intersect at the object plane of the objective lens subsystem between the beam-providing subsystem and the objective lens;
 wherein the beam-providing subsystem comprises:
  a beam-generating subsystem configured to generate the plurality of light beams,
  a beam-conditioning subsystem comprising a plurality of beam-conditioners and configured to receive the plurality of light beams from the beam-generating subsystem, and
  a beam-directing subsystem comprising a plurality of beam-directing elements and configured to receive the plurality of light beams from the beam-generating subsystem and direct the plurality of light beams to intersect at the object plane of the objective lens subsystem.

2. The interference projection exposure system of claim 1, further comprising a pattern mask located at the object plane of the objective lens subsystem, wherein the pattern mask selectively removes or alters a functional element pattern from the periodic optical-intensity distribution.

3. The interference projection exposure system of claim 2, further comprising an automatic alignment controller that adjusts the alignment of the pattern mask.

4. The interference projection exposure system of claim 3, further comprising:
 a second objective lens subsystem, comprising a second image plane, a second objective lens, and a beam splitter;
 wherein the beam splitter is located between the pattern mask and the objective lens and reflects a portion of the plurality of beams from the beam-providing subsystem to the second imaging plane; and
 wherein monitoring and adjusting the alignment of the pattern mask is conducted at the image plane of the second objective lens subsystem.

5. The interference projection exposure system of claim 1, wherein the plurality of light beams is a plurality of collimated light beams.

6. The interference projection exposure system of claim 5, wherein the plurality of collimated light beams diverge or converge at the image plane of the objective lens subsystem in order to produce a periodic lattice with gradually changing periodicity.

7. The interference projection exposure system of claim 1, wherein at least one beam-conditioner in the plurality of beam conditioners comprises a polarizer, an attenuator, and/or a phase shifter.

8. The interference projection exposure system of claim 1, wherein the beam-generating subsystem comprises a wavefront-dividing configuration to generate the plurality of light beams.

9. The interference projection exposure system of claim 1, wherein the beam-generating subsystem comprises a beam-splitting configuration to produce the plurality of light beams.

10. The interference projection exposure system of claim 1, further comprising an immersion fluid having a refractive index greater than unity located between the objective lens and the image plane.

11. A method of producing a periodic optical-intensity distribution, the method comprising:

providing a plurality of light beams with a beam-providing subsystem;

transmitting the plurality of light beams to an objective lens subsystem, the objective lens subsystem comprising an object plane, an objective lens and an image plane configured to receive the plurality of light beams from the beam-providing subsystem, such that the plurality of light beams intersect at the object plane of the objective lens subsystem between the beam-providing subsystem and the objective lens; and directing the plurality of light beams in the objective lens subsystem such that the plurality of beams intersect and interfere at the image plane and produce the periodic optical-intensity distribution;

wherein the beam-providing subsystem comprises:
a beam-generating subsystem configured to generate the plurality of light beams,
a beam-conditioning subsystem comprising a plurality of beam-conditioners and configured to receive the plurality of light beams from the beam-generating subsystem, and
a beam-directing subsystem comprising a plurality of beam-directing elements and configured to receive the plurality of light beams from the beam-generating subsystem and direct the plurality of light beams to intersect at the object plane of the objective lens subsystem.

12. The method of producing a periodic optical-intensity distribution of claim 11, wherein a pattern mask located at the object plane of the objective lens subsystem selectively removes or alters a functional element pattern from the periodic optical-intensity distribution.

13. The method of producing a periodic optical-intensity distribution of claim 12, further comprising monitoring and adjusting the alignment of the pattern mask with respect to a periodic lattice at the objective lens image plane, wherein the pattern mask is located at the object plane of the objective lens subsystem.

14. The method of producing a periodic optical-intensity distribution of claim 13, wherein adjusting the alignment of the pattern mask incorporates automatic feedback control.

15. The method of producing a periodic optical-intensity distribution of claim 13, further comprising a second objective lens subsystem comprising a second image plane, second objective lens, and a beam splitter;
wherein the beam splitter located between the pattern mask and the first objective lens reflects a portion of the plurality of beams from the beam-providing subsystem to the second imaging plane; and
wherein monitoring and adjusting the alignment of the pattern mask is conducted at the image plane of the second objective lens subsystem, in parallel with the formation of a pattern at the image plane of the first objective lens.

16. The method of producing a periodic optical-intensity distribution of claim 11, wherein the plurality of light beams is a plurality of collimated light beams.

17. The method of producing a periodic optical-intensity distribution of claim 16, wherein the plurality of collimated light beams diverge or converge at the image plane of the objective lens in order to produce a periodic lattice with gradually changing periodicity.

18. The method of producing a periodic optical-intensity distribution of claim 11, wherein at least one beam-conditioner in the plurality of beam conditioners comprises a polarizer, an attenuator, and/or a phase shifter.

19. The method of producing a periodic optical-intensity distribution of claim 11, further comprising the step of configuring at least one beam-conditioner to produce a predetermined polarization, amplitude, and/or phase.

20. The method of producing a periodic optical-intensity distribution of claim 11, wherein the beam-generating subsystem comprises a wavefront-dividing configuration to generate the plurality of light beams.

21. The method of producing a periodic optical-intensity distribution of claim 11, wherein the beam-generating subsystem comprises a beam-splitting configuration to produce the plurality of light beams.

22. The method of producing a periodic optical-intensity distribution of claim 11, further comprising an immersion fluid having a refractive index greater than unity located between the objective lens and the image plane.

* * * * *